US012590915B1

(12) United States Patent
Brinkerhoff et al.

(10) Patent No.: US 12,590,915 B1
(45) Date of Patent: Mar. 31, 2026

(54) SYSTEMS AND METHODS FOR DETERMINING THERMAL CHARACTERISTICS OF ELECTROCHEMICAL CELLS IN AN ENERGY STORAGE SYSTEM

(71) Applicant: Element Energy, Inc., Menlo Park, CA (US)

(72) Inventors: Nathan Thomas Brinkerhoff, Santa Clara, CA (US); Corrado Cammi, Mountain View, CA (US); Arnaud Devie, Menlo Park, CA (US)

(73) Assignee: Element Energy, Inc., Menlo Park, CA (US)

( * ) Notice: Subject to any disclaimer, the term of this patent is extended or adjusted under 35 U.S.C. 154(b) by 0 days.

(21) Appl. No.: 19/235,467

(22) Filed: Jun. 11, 2025

(51) Int. Cl.
| | |
|---|---|
| *G01N 25/18* | (2006.01) |
| *G01R 31/3835* | (2019.01) |
| *H01M 10/48* | (2006.01) |
| *H01M 10/633* | (2014.01) |

(52) U.S. Cl.
CPC ......... *G01N 25/18* (2013.01); *G01R 31/3835* (2019.01); *H01M 10/482* (2013.01); *H01M 10/633* (2015.04)

(58) Field of Classification Search
CPC . G01N 25/18; G01R 31/3835; H01M 10/482; H01M 10/633
USPC ......................................................... 702/63
See application file for complete search history.

(56) References Cited

U.S. PATENT DOCUMENTS

| | | | |
|---|---|---|---|
| 11,269,012 B1 | 3/2022 | Kahn et al. | |
| 12,218,328 B1 | 2/2025 | Brinkerhoff et al. | |
| 2020/0127342 A1 * | 4/2020 | Grimaud | H01M 10/625 |
| 2022/0085431 A1 * | 3/2022 | Guillet | H02J 7/007194 |
| 2023/0131786 A1 * | 4/2023 | Del Core | B60L 58/40 |
| | | | 320/136 |

FOREIGN PATENT DOCUMENTS

DE 102020212193 A1 * 3/2022 .......... H01M 10/482

OTHER PUBLICATIONS

English translation of DE-102020212193, Mar. 31, 2022. (Year: 2022).*

* cited by examiner

*Primary Examiner* — Michael P Nghiem
(74) *Attorney, Agent, or Firm* — PdZ Patent Law, PLLC

(57) ABSTRACT

A method for determining respective thermal characteristics of a plurality of electrochemical cell assemblies in an energy storage system includes (1) sensing open circuit voltage of each electrochemical cell assembly of the plurality of electrochemical cell assemblies over a measurement time period, (2) controlling temperature control equipment of the energy storage system to change a temperature setpoint of a heat transfer fluid during the measurement time period, (3) generating a respective voltage profile for each electrochemical cell assembly, (4) determining a respective electrical time constant for each electrochemical cell assembly from the respective voltage profile for the electrochemical cell assembly, and (5) determining a respective thermal characteristic for each electrochemical cell assembly at least partially based on the respective electrical time constant for the electrochemical cell assembly.

18 Claims, 14 Drawing Sheets

400

500

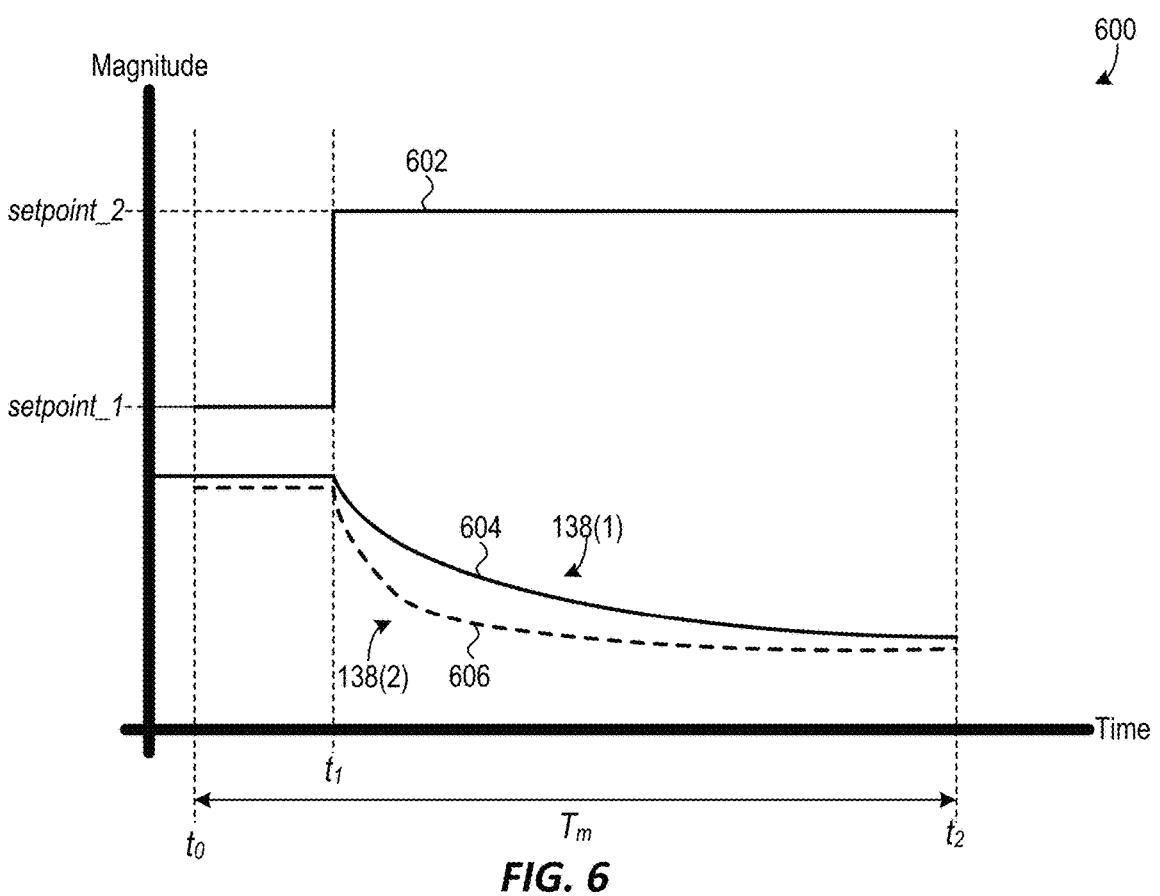
FIG. 6
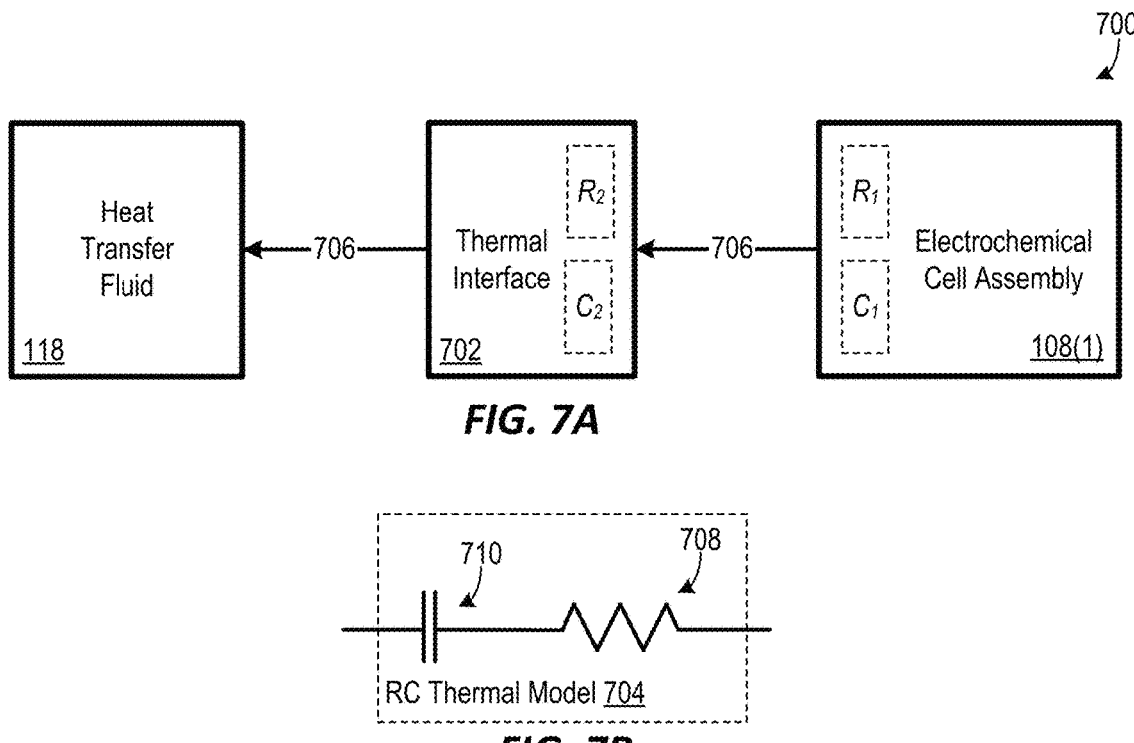
FIG. 7A
FIG. 7B

800

900

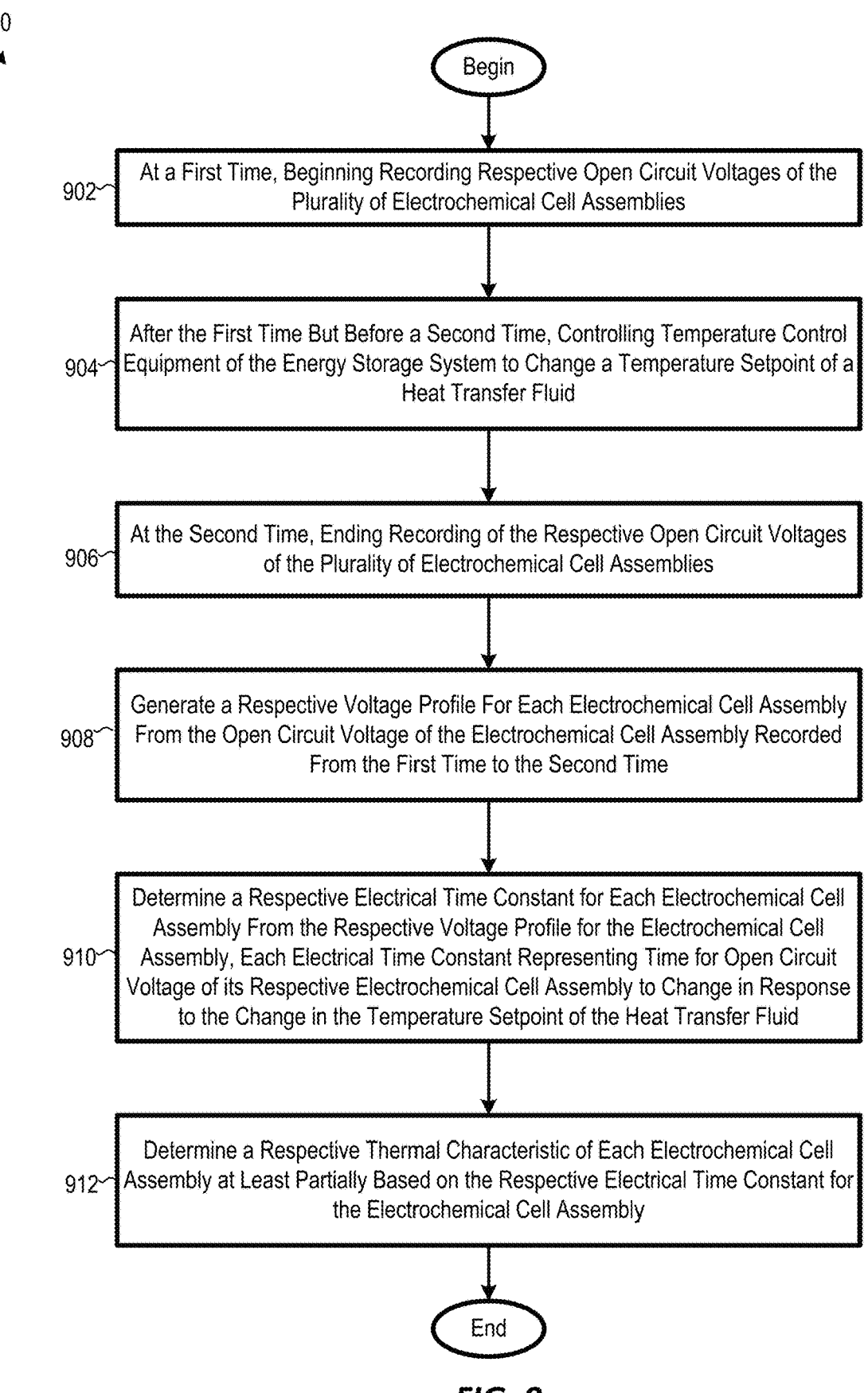

Begin

902 — At a First Time, Beginning Recording Respective Open Circuit Voltages of the Plurality of Electrochemical Cell Assemblies 904 — After the First Time But Before a Second Time, Controlling Temperature Control Equipment of the Energy Storage System to Change a Temperature Setpoint of a Heat Transfer Fluid 906 — At the Second Time, Ending Recording of the Respective Open Circuit Voltages of the Plurality of Electrochemical Cell Assemblies 908 — Generate a Respective Voltage Profile For Each Electrochemical Cell Assembly From the Open Circuit Voltage of the Electrochemical Cell Assembly Recorded From the First Time to the Second Time 910 — Determine a Respective Electrical Time Constant for Each Electrochemical Cell Assembly From the Respective Voltage Profile for the Electrochemical Cell Assembly, Each Electrical Time Constant Representing Time for Open Circuit Voltage of its Respective Electrochemical Cell Assembly to Change in Response to the Change in the Temperature Setpoint of the Heat Transfer Fluid 912 — Determine a Respective Thermal Characteristic of Each Electrochemical Cell Assembly at Least Partially Based on the Respective Electrical Time Constant for the Electrochemical Cell Assembly

End

*FIG. 9*

1000

| | $C_1$ | $C_2$ | $C_3$ | $C_4$ |
|---|---|---|---|---|

$R_4$   ECA 108(29)  $V_{cell}^{+}(29)$   ECA 108(30)  $V_{cell}^{+}(30)$   ECA 108(31)  $V_{cell}^{+}(31)$   ECA 108(32)  $V_{cell}^{+}(32)$ $R_3$   ECA 108(25)  $V_{cell}^{+}(25)$   ECA 108(26)  $V_{cell}^{+}(26)$   ECA 108(27)  $V_{cell}^{+}(27)$   ECA 108(28)  $V_{cell}^{+}(28)$ $R_2$   ECA 108(21)  $V_{cell}^{+}(21)$   ECA 108(22)  $V_{cell}^{+}(22)$   ECA 108(23)  $V_{cell}^{+}(23)$   ECA 108(24)  $V_{cell}^{+}(24)$ $R_1$   ECA 108(17)  $V_{cell}^{+}(17)$   ECA 108(18)  $V_{cell}^{+}(18)$   ECA 108(19)  $V_{cell}^{+}(19)$   ECA 108(20)  $V_{cell}^{+}(20)$ Energy Storage Assembly (Module, Rack, Stack, or Container) 1008(2)

| | $C_1$ | $C_2$ | $C_3$ | $C_4$ |
|---|---|---|---|---|

$R_4$   ECA 108(13)  $V_{cell}^{+}(13)$   ECA 108(14)  $V_{cell}^{+}(14)$   ECA 108(15)  $V_{cell}^{+}(15)$   ECA 108(16)  $V_{cell}^{+}(16)$ $R_3$   ECA 108(9)  $V_{cell}^{+}(9)$   ECA 108(10)  $V_{cell}^{+}(10)$   ECA 108(11)  $V_{cell}^{+}(11)$   ECA 108(12)  $V_{cell}^{+}(12)$ $R_2$   ECA 108(5)  $V_{cell}^{+}(5)$   ECA 108(6)  $V_{cell}^{+}(6)$   ECA 108(7)  $V_{cell}^{+}(7)$   ECA 108(8)  $V_{cell}^{+}(8)$ $R_1$   ECA 108(1)  $V_{cell}^{+}(1)$   ECA 108(2)  $V_{cell}^{+}(2)$   ECA 108(3)  $V_{cell}^{+}(3)$   ECA 108(4)  $V_{cell}^{+}(4)$ Energy Storage Assembly (Module, Rack, Stack, or Container) 1008(1)

Energy Storage System 1002

Controller 1004

*FIG. 10*

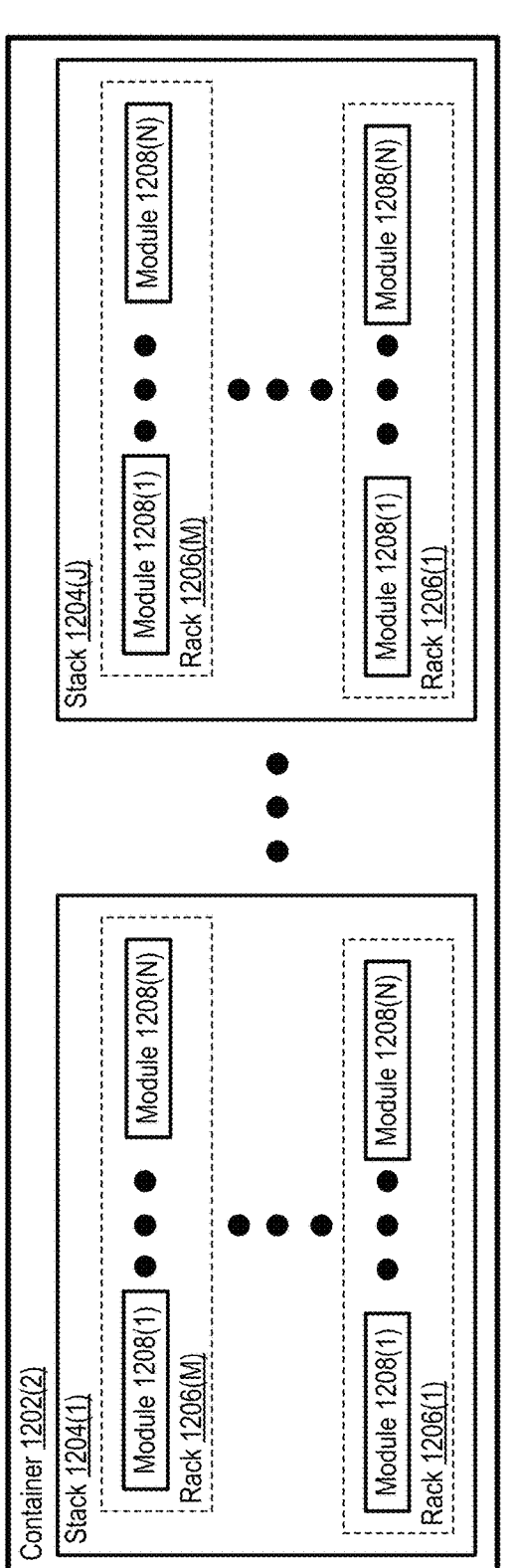
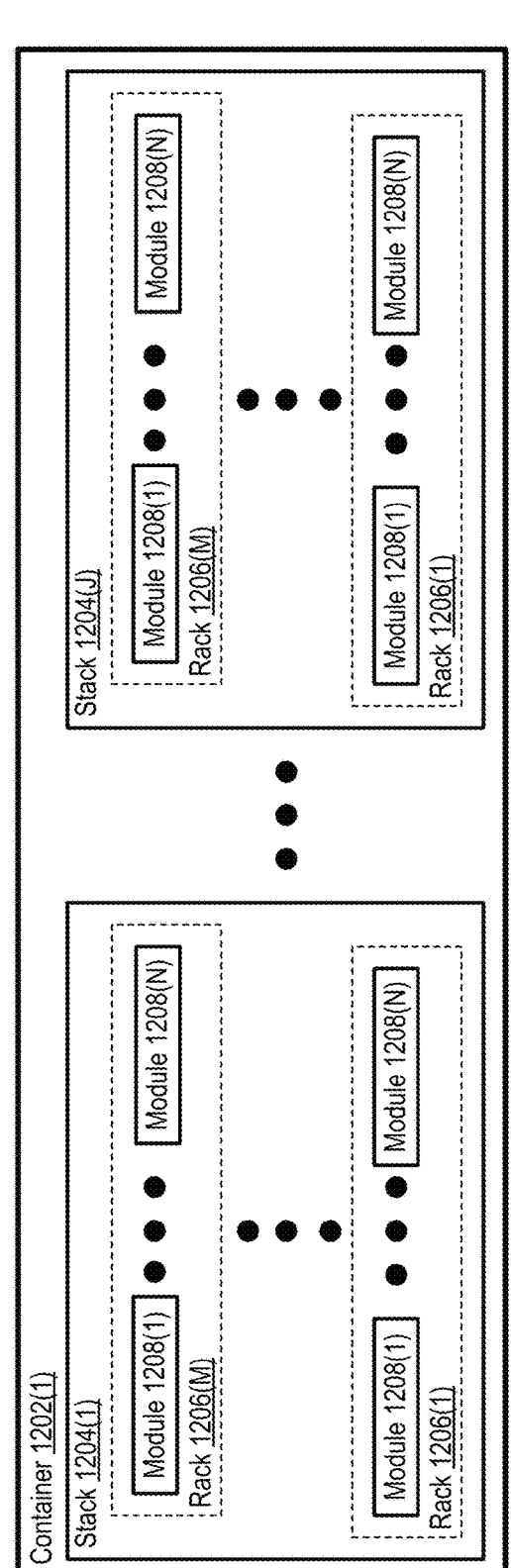
*FIG. 12*

1300

|  | $C_1$ | $C_2$ | $C_3$ | $C_4$ |
|---|---|---|---|---|
| $R_4$ | ECA 108(29) $V_{cell}^{+}(29)$ | ECA 108(30) $V_{cell}^{+}(30)$ | ECA 108(31) $V_{cell}^{+}(31)$ | ECA 108(32) $V_{cell}^{+}(32)$ |
| $R_3$ | ECA 108(25) $V_{cell}^{+}(25)$ | ECA 108(26) $V_{cell}^{+}(26)$ | ECA 108(27) $V_{cell}^{+}(27)$ | ECA 108(28) $V_{cell}^{+}(28)$ |
| $R_2$ | ECA 108(21) $V_{cell}^{+}(21)$ | ECA 108(22) $V_{cell}^{+}(22)$ | ECA 108(23) $V_{cell}^{+}(23)$ | ECA 108(24) $V_{cell}^{+}(24)$ |
| $R_1$ | ECA 108(17) $V_{cell}^{+}(17)$ | ECA 108(18) $V_{cell}^{+}(18)$ | ECA 108(19) $V_{cell}^{+}(19)$ | ECA 108(20) $V_{cell}^{+}(20)$ |

1344

Energy Storage Assembly (Module, Rack, Stack, or Container) 1308(2)

|  | $C_1$ | $C_2$ | $C_3$ | $C_4$ |
|---|---|---|---|---|
| $R_4$ | ECA 108(13) $V_{cell}^{+}(13)$ | ECA 108(14) $V_{cell}^{+}(14)$ | ECA 108(15) $V_{cell}^{+}(15)$ | ECA 108(16) $V_{cell}^{+}(16)$ |
| $R_3$ | ECA 108(9) $V_{cell}^{+}(9)$ | ECA 108(10) $V_{cell}^{+}(10)$ | ECA 108(11) $V_{cell}^{+}(11)$ | ECA 108(12) $V_{cell}^{+}(12)$ |
| $R_2$ | ECA 108(5) $V_{cell}^{+}(5)$ | ECA 108(6) $V_{cell}^{+}(6)$ | ECA 108(7) $V_{cell}^{+}(7)$ | ECA 108(8) $V_{cell}^{+}(8)$ |
| $R_1$ | ECA 108(1) $V_{cell}^{+}(1)$ | ECA 108(2) $V_{cell}^{+}(2)$ | ECA 108(3) $V_{cell}^{+}(3)$ | ECA 108(4) $V_{cell}^{+}(4)$ |

1342

Energy Storage Assembly (Module, Rack, Stack, or Container) 1308(1)

Energy Storage System 1302

Controller 1304

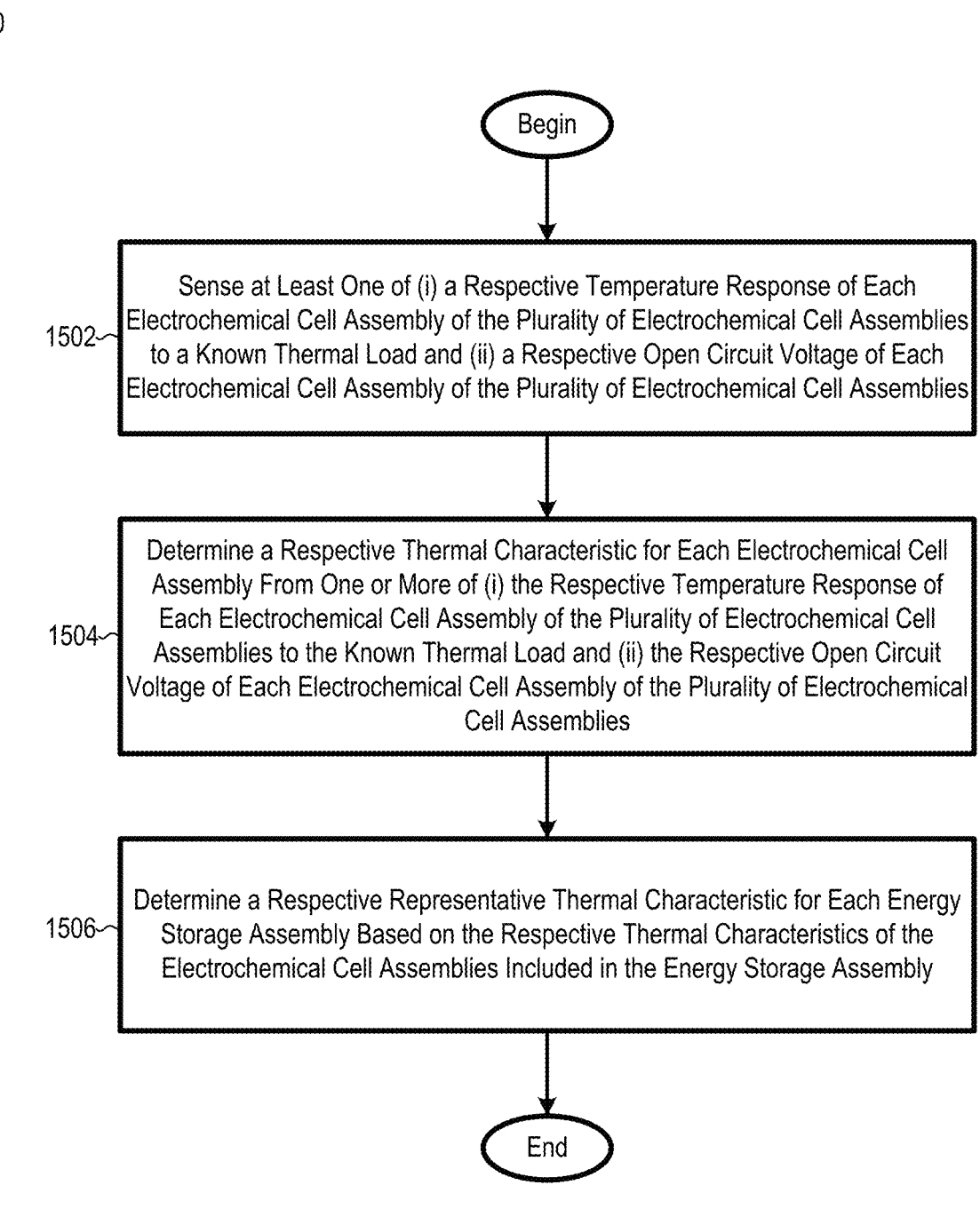

Begin

1502 — Sense at Least One of (i) a Respective Temperature Response of Each Electrochemical Cell Assembly of the Plurality of Electrochemical Cell Assemblies to a Known Thermal Load and (ii) a Respective Open Circuit Voltage of Each Electrochemical Cell Assembly of the Plurality of Electrochemical Cell Assemblies 1504 — Determine a Respective Thermal Characteristic for Each Electrochemical Cell Assembly From One or More of (i) the Respective Temperature Response of Each Electrochemical Cell Assembly of the Plurality of Electrochemical Cell Assemblies to the Known Thermal Load and (ii) the Respective Open Circuit Voltage of Each Electrochemical Cell Assembly of the Plurality of Electrochemical Cell Assemblies 1506 — Determine a Respective Representative Thermal Characteristic for Each Energy Storage Assembly Based on the Respective Thermal Characteristics of the Electrochemical Cell Assemblies Included in the Energy Storage Assembly End

*FIG. 15*

SYSTEMS AND METHODS FOR DETERMINING THERMAL CHARACTERISTICS OF ELECTROCHEMICAL CELLS IN AN ENERGY STORAGE SYSTEM

BACKGROUND

An electrochemical cell is a device that stores energy. One popular electrochemical cell is the Lithium-ion (Li-ion) electrochemical cell. Examples of Li-ion electrochemical cells include Lithium Cobalt Oxide (LCO) electrochemical cells, Lithium Manganese Oxide (LMO) electrochemical cells, Lithium Nickel Manganese Cobalt Oxide (NMC) electrochemical cells, Lithium Iron Phosphate (LFP) elec-trochemical cells, Lithium Nickel Cobalt Aluminum Oxide (NCA) electrochemical cells, and Lithium Titanate (LTO) electrochemical cells. An electrochemical cell may be connected to a load to electrically power the load. Additionally, some electrochemical cells may be charged by connecting the electrochemical cell to an electrical energy source. Multiple electrochemical cells may be electrically coupled in a battery, such as to achieve a greater voltage and/or a greater capacity than can be realized by a single electrochemical cell.

Temperature of an electrochemical cell typically must be maintained within a particular temperature range for reliable and safe electrochemical cell operation. For example, overheating of an electrochemical cell may accelerate degradation of the electrochemical cell and may even lead to thermal runaway. Accordingly, energy storage systems including electrochemical cells may include provisions for thermal management. For example, an energy storage system may include temperature control equipment that circulates a heat transfer fluid along the electrochemical cells to transfer heat between the electrochemical cells and the heat transfer fluid, thereby maintaining a desired temperature range of the electrochemical cells.

SUMMARY

Disclosed herein are new systems and methods for determining thermal characteristics of electrochemical cell assemblies in an energy storage system. The new systems and methods leverage the fact that open circuit voltage of an electrochemical cell is a function of temperature of the electrochemical cell in certain state of charge ranges, thereby enabling determination of one or more thermal characteristics of an electrochemical cell assembly from open circuit voltage of the electrochemical cell assembly. Accordingly, particular embodiments of the new systems and methods are configured to determine one or more thermal characteristics of all electrochemical cell assemblies in an energy storage without use of temperature sensing devices and with greater accuracy than is feasible by using a nominal model of the electrochemical cells. For example, in some embodiments, (i) a temperature step change is applied in free stream temperature of a heat transfer fluid, (ii) open circuit voltage of each electrochemical cell assembly is monitored, (iii) a respective electrical time constant is determined for each electrochemical cell assembly from change in respective open circuit voltage of the electrochemical cell assembly resulting from the temperature step change, and (iv) respective thermal characteristics of the electrochemical cell assemblies are obtained from the electrical time constants. In some embodiments, the thermal characteristics are compared to determine differences in thermal characteristics among the electrochemical cell assemblies, such as to determine differences in respective thermal resistances of the electrochemical cell assemblies. As such, the new systems and methods promote accurate and low-cost thermal monitoring of electrochemical cell assemblies in an energy storage system.

In an embodiment, a method for determining respective thermal characteristics of a plurality of electrochemical cell assemblies in an energy storage system includes (a) sensing open circuit voltage of each electrochemical cell assembly of the plurality of electrochemical cell assemblies over a measurement time period, (b) during the measurement time period, controlling temperature control equipment of the energy storage system to change a temperature setpoint of a heat transfer fluid, the heat transfer fluid being in thermal communication with the plurality of electrochemical cell assemblies, (c) generating a respective voltage profile for each electrochemical cell assembly, each voltage profile representing open circuit voltage of its respective electrochemical cell assembly over the measurement time period, (d) determining a respective electrical time constant for each electrochemical cell assembly from the respective voltage profile for the electrochemical cell assembly, each electrical time constant representing time for open circuit voltage of its respective electrochemical cell assembly to change in response to the change of the temperature setpoint of the heat transfer fluid, and (e) determining a respective thermal characteristic for each electrochemical cell assembly at least partially based on the respective electrical time constant for the electrochemical cell assembly.

In an embodiment, a method for determining respective thermal characteristics of a plurality of electrochemical cell assemblies in an energy storage system includes (a) at a first time, beginning recording of respective open circuit voltages of the plurality of electrochemical cell assemblies, (b) after the first time but before a second time, controlling temperature control equipment of the energy storage system to change a temperature setpoint of a heat transfer fluid, the heat transfer fluid being in thermal communication with the plurality of electrochemical cell assemblies, (c) at the second time, ending recording of the respective open circuit voltages of the plurality of electrochemical cell assemblies, (d) generating a respective voltage profile for each electrochemical cell assembly from the respective open circuit voltages of the electrochemical cell assembly recorded from the first time to the second time, (e) determining a respective electrical time constant for each electrochemical cell assembly from the respective voltage profile for the electrochemical cell assembly, each electrical time constant representing time for open circuit voltage of its respective electrochemical cell assembly to change in response to the change of the temperature setpoint of the heat transfer fluid, and (f) determining a respective thermal characteristic for each electrochemical cell assembly at least partially based on the respective electrical time constant for the electrochemical cell assembly.

In an embodiment, a method for evaluating thermal performance of an energy storage system including a plurality of electrochemical cell assemblies, the plurality of electrochemical cell assemblies being distributed among a plurality of energy storage assemblies in the energy storage system such that each energy storage assembly includes a respective two or more electrochemical cell assemblies of the plurality of electrochemical cell assemblies, includes (a) sensing at least one of (i) a respective temperature response of each electrochemical cell assembly of the plurality of electrochemical cell assemblies to a known thermal load and (ii) a respective open circuit voltage of each electrochemical cell assembly of the plurality of electrochemical cell assemblies, (b) determining a respective thermal characteristic for each electrochemical cell assembly from one or more of (i) the respective temperature response of each electrochemical cell assembly of the plurality of electrochemical cell assemblies to the known thermal load and (ii) the respective open circuit voltage of each electrochemical cell assembly of the plurality of electrochemical cell assemblies, and (c) determining a respective representative thermal characteristic for each energy storage assembly based on the respective thermal characteristics of the electrochemical cell assemblies included in the energy storage assembly.

In an embodiment, a method for evaluating thermal performance of an energy storage system including a plurality of electrochemical cell assemblies, the plurality of electrochemical cell assemblies being distributed among a plurality of energy storage assemblies in the energy storage system such that each energy storage assembly includes a respective two or more electrochemical cell assemblies of the plurality of electrochemical cell assemblies, includes (a) sensing at least one of (i) a respective temperature response of each electrochemical cell assembly of the plurality of electrochemical cell assemblies to a known thermal load and (ii) a respective open circuit voltage of each electrochemical cell assembly of the plurality of electrochemical cell assemblies, (b) determining a respective thermal characteristic for each electrochemical cell assembly from one or more of (i) the respective temperature response of each electrochemical cell assembly of the plurality of electrochemical cell assemblies to the known thermal load and (ii) the respective open circuit voltage of each electrochemical cell assembly of the plurality of electrochemical cell assemblies, and (c) comparing respective thermal characteristics of two or more electrochemical cell assemblies having a common location in their respective energy storage assemblies.

BRIEF DESCRIPTION OF THE DRAWINGS

FIG. 6 is a graph of magnitude versus time illustrating one example of open circuit voltages of two electrochemical cell assemblies of the FIG. 1 electrical environment during execution of several blocks of the FIG. 5 method.

FIG. 7A is a schematic diagram of a thermal environment including a thermal interface.

FIG. 7B illustrates a resistive-capacitive (R-C) thermal model of the FIG. 7A thermal environment.

FIG. 9 is a flow chart of an additional method for determining respective thermal characteristics of a plurality of electrochemical cell assemblies in an energy storage system, according to an embodiment.

FIG. 10 is a schematic diagram of an electrical environment including an embodiment of an energy storage system of the FIG. 1 electrical environment where electrochemical cell assemblies are distributed among a plurality of energy storage assemblies.

FIG. 12 is a block diagram of an alternate embodiment of the FIG. 10 energy storage system where electrochemical cell assemblies are distributed among a hierarchy of energy storage assemblies.

FIG. 13 is a schematic diagram of an alternate embodiment of the FIG. 10 electrical environment including temperature sensing devices in energy storage assemblies.

FIG. 15 is a flow chart of a method for evaluating thermal performance of an energy storage system including a plurality of electrochemical cell assemblies, according to an embodiment.

DETAILED DESCRIPTION OF THE EMBODIMENTS

Figure 1:
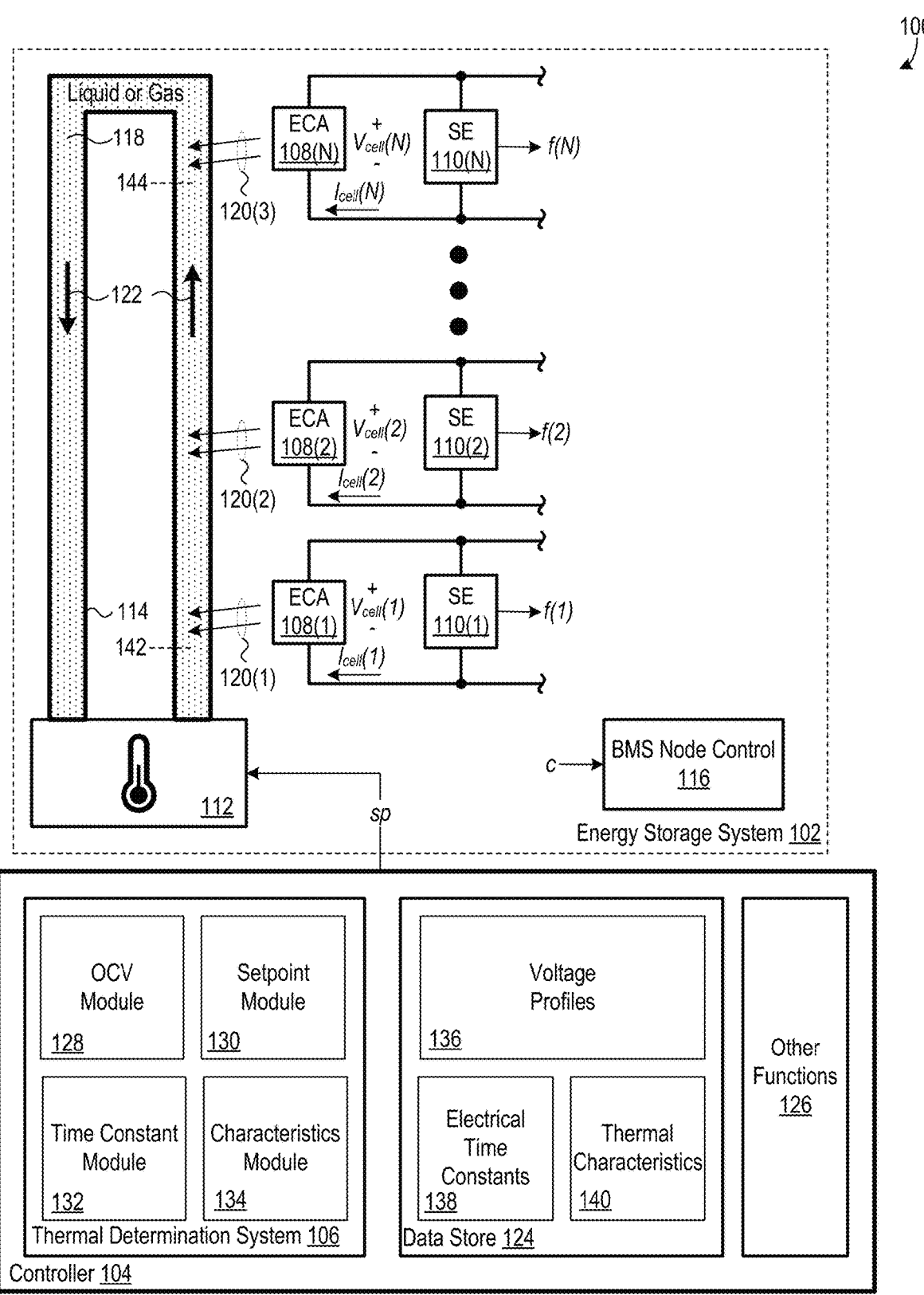
FIG. 1 is a schematic diagram of an electrical environment including a thermal determination system, according to an embodiment.

Conventional energy storage systems include one or more temperature sensing devices, e.g., thermistors, to monitor electrochemical cell temperature, such as to help ensure that electrochemical cell temperature remains within a particular temperature range for reliable and safe electrochemical cell operation. However, it may be difficult and costly to attach temperature sensors to electrochemical cells and to wire the temperature sensors to a battery management system (BMS) controls or other monitoring equipment. Consequentially, a conventional energy storage system typically does not include a respective temperature sensing device for each electrochemical cell of the system. Instead, a conventional energy storage system typically includes temperature sensing devices for sensing respective temperatures of a small percentage, e.g., five percent, of the electrochemical cells in the energy storage system. The respective temperatures of the remaining electrochemical cells of the energy storage system are typically estimated using thermal network models based on nominal electrochemical cells. Alternately, some energy storage systems do not consider respective temperatures of electrochemical cells that are not monitored by a temperature sensing device.

Estimating temperature of an electrochemical cell based on a model of the electrochemical cell may be adequate in situations where the model accurately reflects thermal characteristics of the electrochemical cell. However, a model of an electrochemical cell may be inaccurate because thermal characteristics of a particular electrochemical cell may be significantly different from thermal characteristics of a nominal electrochemical cell. For example, a given electrochemical cell may be relatively thermally isolated from a heat transfer fluid of a temperature control system, potentially resulting in poor transfer of heat between the electrochemical cell and heat transfer fluid. The thermal isolation may be caused, for example, by manufacturing errors, energy storage system build tolerances, loose hardware, heat transfer fluid decomposition, mechanical damage such as from vibration or a mechanical shock, mechanical damage from electrochemical cell swelling, poor temperature control system design, heat exchanger damage, and/or thermal interface layer wear-out, which are frequently not readily detectable. As another example, a given electrochemical cell may be more prone to self-heating than a nominal electrochemical cell due to elevated equivalent series resistance (ESR) of the electrochemical cell, elevated state of degradation (SOD) of the electrochemical cell, and/or presence of short circuits within the electrochemical cell.

Inaccuracies in electrochemical cell temperature data may be highly problematic. For example, assume that an actual temperature of a given electrochemical cell in an energy storage system is significantly higher than an estimated temperature of the electrochemical cell because the electrochemical cell is relatively thermally isolated from a heat transfer fluid due to a heat exchanger assembly error. The energy storage system may allow the electrochemical cell to operate at an elevated temperature, potentially leading to elevated SOD or even dangerous electrochemical cell failure, due to erroneous temperature data indicating that the temperature of the electrochemical cell is lower than it really is. Additionally, elevated temperature operation of one electrochemical cell in an energy storage system resulting from inaccurate temperature data may adversely affect other electrochemical cells of the energy storage system. Accordingly, there are serious drawbacks to estimating electrochemical cell temperature using a nominal model of the electrochemical cell.

Disclosed herein are systems and methods for determining thermal characteristics of electrochemical cell assemblies in an energy storage system which at least partially overcome the problems discussed above. The new systems and methods leverage the fact that open circuit voltage of an electrochemical cell is a function of temperature of the electrochemical cell in certain state of charge ranges, thereby enabling determination of one or more thermal characteristics of the electrochemical cell from open circuit voltage of the electrochemical cell. Accordingly, particular embodiments of the new systems and methods are configured to determine one or more thermal characteristics of all electrochemical cell assemblies in an energy storage without use of temperature sensing devices and with greater accuracy than is feasible by using a nominal model of the electrochemical cells. For example, in some embodiments, (i) a temperature step change is applied in free stream temperature of a heat transfer fluid, (ii) open circuit voltage of each electrochemical cell assembly is monitored, (iii) a respective electrical time constant is determined for each electrochemical cell assembly from change in respective open circuit voltage of the electrochemical cell assembly resulting from the temperature step change, and (iv) respective thermal characteristics of the electrochemical cell assemblies are obtained from the electrical time constants. In some embodiments, the thermal characteristics are compared to determine differences in thermal characteristics among the electrochemical cell assemblies, such as to determine differences in respective thermal resistances of the electrochemical cell assemblies. As such, the new systems and methods promote accurate and low-cost thermal monitoring of electrochemical cell assemblies in an energy storage system.

FIG. 1 is a schematic diagram of an electrical environment 100 including an energy storage system 102 and a controller 104, where controller 104 includes a thermal determination system 106. Thermal determination system 106 is an embodiment of the new systems for determining thermal characteristics of electrochemical cell assemblies in an energy storage system. Energy storage system 102 includes N electrochemical cell assemblies (ECAs) 108, N sensing elements (SEs) 110, temperature control equipment 112, fluid control infrastructure 114, and battery management system (BMS) node control 116, where N is an integer greater than one. In this document, specific instances of an item may be referred to by use of a numeral in parentheses (e.g. electrochemical cell assembly 108(1)) while numerals without parentheses refer to any such item (e.g. electrochemical cell assemblies 108). Although N is depicted in FIG. 1 as being greater than two, N could be equal to two without departing from the scope hereof.

Figure 2:
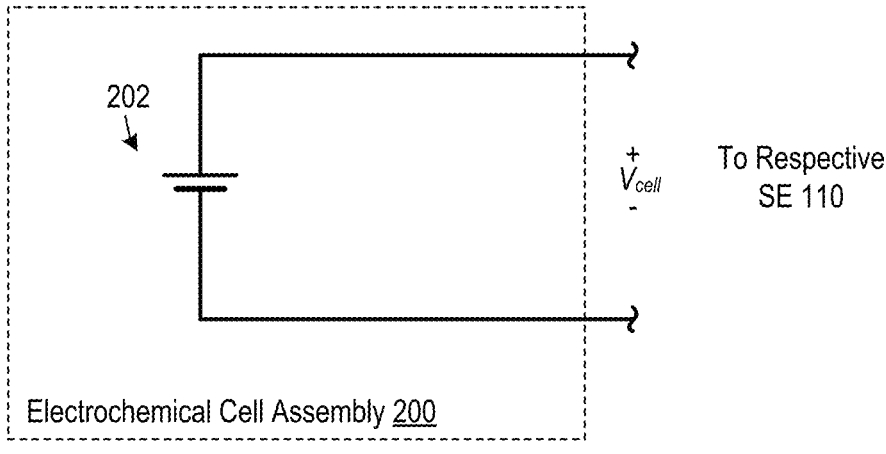
FIG. 2 is a schematic diagram of one embodiment of an electrochemical cell assembly of the FIG. 1 electrical environment.
Figure 3:
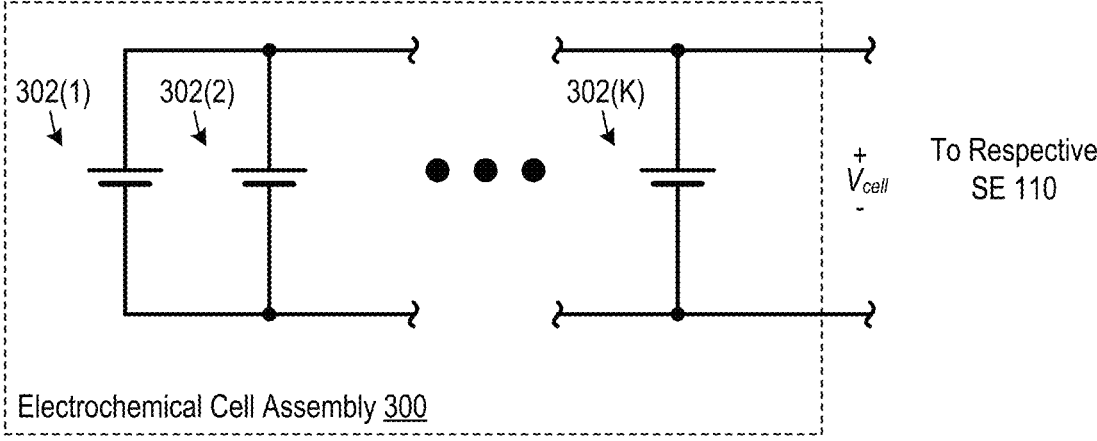
FIG. 3 is a schematic diagram of another embodiment of an electrochemical cell assembly of the FIG. 1 electrical environment.

Each electrochemical cell assembly 108 includes either a single respective electrochemical cell or a plurality of respective electrochemical cells electrically coupled in parallel, where each electrochemical cell of energy storage system 102 is, for instance, a Lithium-ion (Li-ion) electrochemical cell. For example, FIG. 2 is a schematic diagram of an electrochemical cell assembly 200, which is one embodiment of an electrochemical cell assembly 108 instance of FIG. 1. Electrochemical cell assembly 200 consists of a single electrochemical cell 202, and a voltage $V_{cell}$ of electrochemical cell assembly 200 is equal to a voltage across electrochemical cell 202. As another example, FIG. 3 is a schematic diagram of an electrochemical cell assembly 300, which is another embodiment of an electrochemical cell assembly 108 instance of FIG. 1. Electrochemical cell assembly 300 includes K electrochemical cell 302 electrically coupled in parallel, where K is an integer greater than one. A voltage $V_{cell}$ of electrochemical cell assembly 300 is equal to a voltage across the K electrochemical cells electrically coupled in parallel.

Referring again to FIG. 1, each electrochemical cell assembly 108 is electrically coupled to a respective sensing element 110, and each sensing element 110 is configured to generate a feedback signal f for controller 104, where each feedback signal f represents voltage $V_{cell}$ across its respective electrochemical cell assembly 108. In particular, sensing element 110(1) is configured to generate a feedback signal f(1) representing voltage $V_{cell}(1)$ across electrochemical cell assembly 108(1), sensing element 110(2) is configured to generate a feedback signal f(2) representing voltage $V_{cell}(2)$ across electrochemical cell assembly 108(2), and so on. As discussed above, a given electrochemical cell assembly 108 may consist of a single electrochemical cell or include a plurality of electrochemical cells electrically coupled in parallel, and each voltage $V_{cell}$ may therefore represent either a voltage across a single electrochemical cell or a voltage across multiple parallel-connected electrochemical cells, depending on electrochemical cell assembly 108 configuration. Feedback signals f may be analog signals or digital signals. In some embodiments, each feedback signal f represents one or more parameters in addition to voltage $V_{cell}$ of its respective electrochemical cell assembly 108, such as magnitude of current $I_{cell}$ flowing through its respective electrochemical cell assembly 108. Although sensing elements 110 are illustrated as being discrete elements, sensing elements 110 could be combined with one or more other elements of energy storage system 102. Additionally, two or more sensing elements 110 could share circuitry and/or be co-packaged.

While connections between electrochemical cell assemblies 108 are not shown in FIG. 1, electrochemical cell assemblies 108 may be electrically coupled in series, in parallel, or in a combination of series and parallel. For example, multiple electrochemical cell assemblies 108 may be electrically coupled in series to achieve a higher voltage that would be possible with a single electrochemical cell assembly 108. As another example, two or more electrochemical cell assemblies 108 may be electrically coupled in parallel to increase a maximum current rating of energy storage system 102. Connections between two or more electrochemical cell assemblies 108 may be direct, such as via a wire or bus bar, or connections between two or more electrochemical cell assemblies 108 may be indirect, such as via one or more power converters (not shown), such as inverters and/or DC-to-DC converters. In some embodiments, power converters electrically coupling electrochemical cell assemblies are part of BMS node control 116 (discussed below).

BMS node control 116 controls charging and discharging of electrochemical cell assemblies 108 at least partially in response to control signals c generated by controller 104. BMS node control 116 includes, for example, one or more switches and/or one or more power converters (e.g., inverters and/or DC-to-DC converters). Although BMS node control 116 is symbolically shown as a single element, BMS node control 116 may include multiple elements. For example, in some embodiments, electrochemical cell assemblies 108 are divided into two or more groups of multiple electrochemical cell assemblies, and BMS node control 116 includes respective BMS node control circuitry (e.g., one or more switches and/or one or more power converters) for each group, to enable individual control of charging and discharging of each group of electrochemical cell assemblies 108. As another example, in certain embodiments, BMS node control 116 includes respective BMS node control circuitry (e.g., one or more switches and/or one or more power converters) for each electrochemical cell assembly 108, to enable individual control of charging and discharging of each electrochemical cell assembly 108. BMS node control 116 could also be partially or fully combined with one or more other elements of energy storage system 102. For example, in particular embodiments, BMS node control 116 includes a respective power converter for each electrochemical cell assembly 108 that is integrated with the respective sensing element 110 for the electrochemical cell assembly 108.

Connections between energy storage system 102 and controller 104 are not shown for illustrative clarity, but it is understood that control signals c and feedback signals f are communicatively coupled between energy storage system 102 and controller 104, for example, via one or more electrical communication links (not shown), one or more optical communication links (e.g., an optical cable communication link or a free space optical communication link) (not shown), and/or one more radio frequency (RF) communications links (e.g., a waveguide RF communication link or a free space RF communication link) (not shown).

Temperature control equipment 112 and fluid control infrastructure 114 collectively form a temperature control system for controlling temperature of electrochemical cell assemblies 108. In particular, fluid control infrastructure 114 carries a heat transfer fluid 118 along electrochemical cell assemblies 108, such that each electrochemical cell assembly 108 is directly or indirectly in thermal communication with heat transfer fluid 118. Consequently, heat is transferred from each electrochemical cell assembly 108 to heat transfer fluid 118, as symbolically shown by arrows 120. Heat transfer from an electrochemical cell assembly 108 to heat transfer fluid 118 may be positive such that heat transfer fluid 118 cools the electrochemical cell assembly 108, or heat transfer from an electrochemical cell assembly 108 to heat transfer fluid 118 may be negative such that heat transfer fluid 118 heats the electrochemical cell assembly 108, depending on the relative temperatures of heat transfer fluid 118 and the electrochemical cell assembly 108. Heat transfer fluid 118 is, for example, a liquid (e.g., water, a mixture of water and antifreeze, oil, or a liquid refrigerant) or a gas (e.g., air or gaseous refrigerant).

Fluid control infrastructure 114 includes, for example, one or more of ducts, pipes, channels, valves, dampers, thermal interfaces, heat exchangers, etc., that are collectively configured to route heat transfer fluid 118 within energy storage system 102 such that each electrochemical cell assembly 108 is directly or indirectly in thermal communication with heat transfer fluid 118. Temperature control equipment 112 is configured to maintain a temperature of heat transfer fluid 118 at least partially under the control of a signal sp generated controller 104, and temperature control equipment 112 is further configured to circulate heat transfer fluid 118 through fluid control infrastructure 114, as symbolically shown by arrows 122. In some embodiments, temperature control equipment 112 includes one or more of a pump, a fan, a chiller, a heater, and a heat exchanger. Although fluid control infrastructure 114 is depicted as forming a closed loop such that heat transfer fluid 118 is recirculated, in some alternate embodiments, fluid control infrastructure 114 is configured as an open loop such that heat transfer fluid 118 is not recirculated. Additionally, while fluid control infrastructure 114 is illustrated as forming a loop, fluid control infrastructure 114 could have a different topology as long as heat transfer fluid 118 is directly or indirectly in thermal communication with each electrochemical cell assembly 108. Additionally, in particular alternate embodiments, temperature control equipment 112 and fluid control infrastructure 114 are replaced with two or more temperature control systems, such as with respective temperature control systems for groups of electrochemical cell assemblies 108 or even with a respective temperature control system of each electrochemical cell assembly 108.

Controller 104 includes a data store 124 and other functions 126 in addition to thermal determination system 106. Thermal determination system 106 includes an open circuit voltage (OCV) module 128, a setpoint module 130, a time constant module 132, and a characteristics module 134. Data store 124 includes voltage profiles 136, electrical time constants 138, and thermal characteristics 140.

The following is a brief summary of the elements of thermal determination system 106. Examples of operation of thermal determination system 106 are discussed below with respect to FIGS. 5, 8, and 9, although it is understood that thermal determination system 106 is not limited to operating according to the examples of FIGS. 5, 8, and 9.

(1) Open circuit voltage module 128 is configured to sense open circuit voltage of each electrochemical cell assembly 108, such as from feedback signals f received from sensing elements 110, to generate a respective voltage profile 136 for each electrochemical cell assembly 108 over a measurement time period. The respective voltage profile 136 of each electrochemical cell assembly 108 represents open circuit voltage of the electrochemical cell assembly 108 as a function of time over the measurement time period. As discussed below, the measurement time period includes at least a period of time after setpoint module 130 changes a temperature setpoint of heat transfer fluid 118. Particular embodiments of open circuit voltage module 128 are also configured to determine if one or more prerequisites are satisfied before beginning to sense respective open circuit voltages of electrochemical cell assemblies 108. In certain embodiments, open circuit voltage of a given electrochemical cell assembly 108 is voltage $V_{cell}$ of the electrochemical cell assembly 108 when magnitude of change in voltage $V_{cell}$ with respect to change in time ($dV_{cell}/dt$) is either zero or does not exceed a predetermined maximum permissible value, to ensure sensed voltage of the electrochemical cell assembly 108 is at least substantially a relaxed voltage of the electrochemical cell assembly 108.

(2) Setpoint module 130 is configured to control temperature control equipment 112 by generating signal sp which specifies a temperature setpoint of heat transfer fluid 118 to be maintained by temperature control equipment 112.

(3) Time constant module 132 is configured to determine a respective electrical time constant 138 for each electrochemical cell assembly 108 from the respective voltage profile 136 of the electrochemical cell assembly 108, where each electrical time constant 138 represents time for open circuit voltage of its respective electrochemical cell assembly 108 to change in response to a change of the temperature setpoint of heat transfer fluid 118.

(4) Characteristics module 134 is configured to determine a respective thermal characteristic 140 for each electrochemical cell assembly 108 at least partially based on the respective electrical time constant 138 for the electrochemical cell assembly 108, where each thermal characteristic 140 includes, for example, one or more of an absolute thermal resistance, a relative thermal resistance, an absolute thermal time constant, a relative thermal time constant, a resistive-capacitive (RC) thermal model of the electrochemical cell assembly, etc. In embodiments where each electrochemical cell assembly 108 includes two or more electrochemical cells 108, the respective thermal characteristic 140 of the electrochemical cell assembly 108 will be a function of the constituent electrochemical cell's respective thermal characteristics.

Other functions 126 are configured to generate control signals c to control BMS node control 116, for example, to control charging and discharging of electrochemical cell assemblies 108, such as to implement one or more charging algorithms and/or discharging algorithms. Other functions 126 could be omitted from controller 104, and in such case, one or more additional controllers (not shown) may take the place of other functions 126. Furthermore, in some alternate embodiments, other functions 126 and BMS node control 116 are completely omitted from electrical environment 100.

The elements of controller 104 need not be co-packaged or co-located. For example, in certain embodiments, some elements of controller 104 are located in or near energy storage system 102, while other elements of controller 104 are remotely located from energy storage system 102. The remotely located elements could be embodied, for example, by a controller implemented in a distributed computing system, e.g., in a cloud computing system. While controller 104 is depicted as being separate from energy storage system 102, controller 104 could instead be partially or fully integrated in energy storage system 102.

Figure 4:
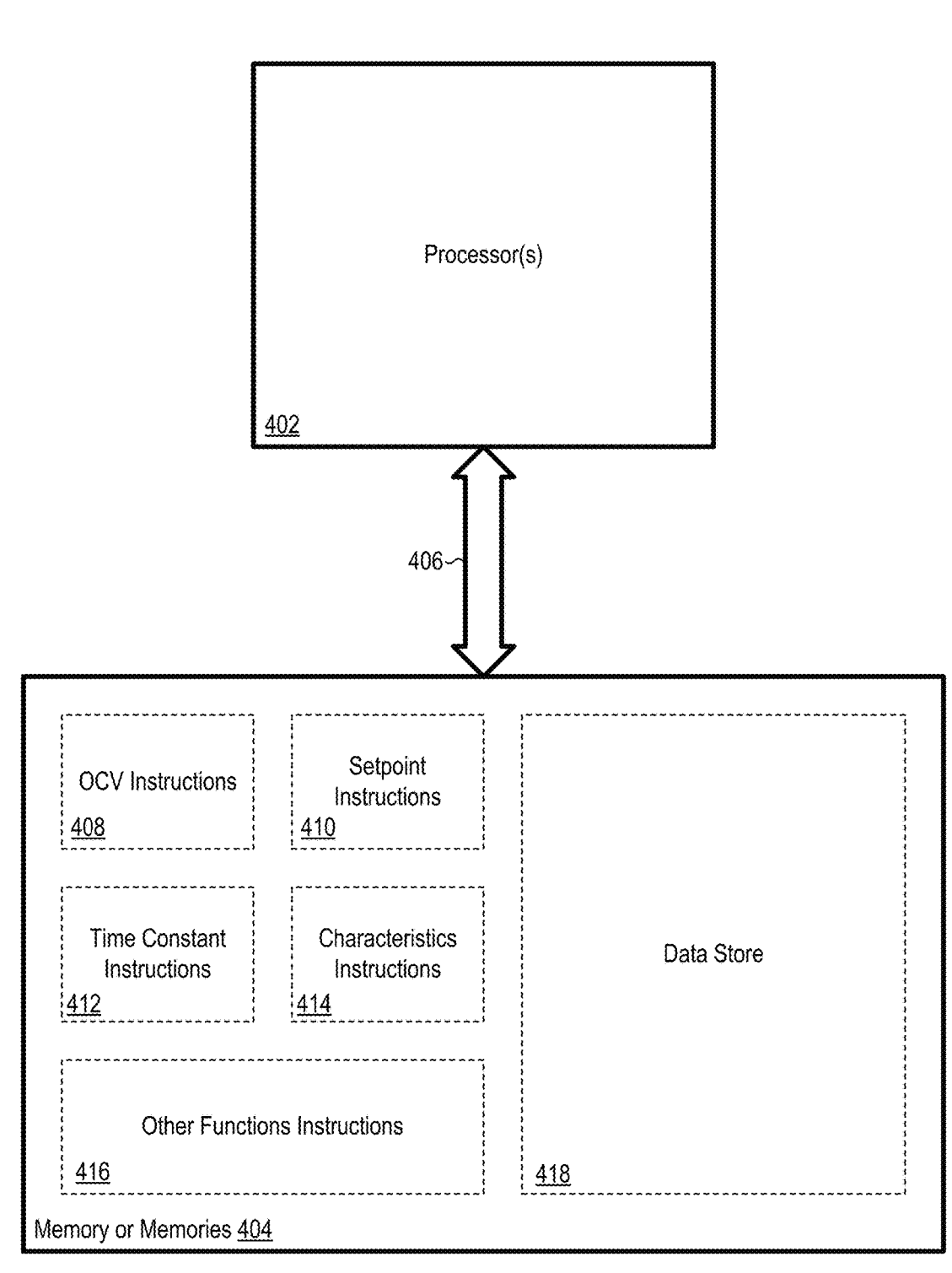
FIG. 4 is a block diagram of one embodiment of a controller of the FIG. 1 electrical environment.

The elements of controller 104 are implemented, for example, by analog and/or digital electronic circuitry. In some embodiments, one or more elements of controller 104 are at least partially implemented by one or more processors executing non-transitory instructions, such as software and/or firmware, stored in one or more memories or other storage elements. For example, FIG. 4 is a block diagram of a controller 400, which is one possible embodiment of controller 104, although it is understood that controller 104 is not limited to the FIG. 4 embodiment. Controller 400 includes one or more processors 402, henceforth referred to as "processors 402" for brevity, and one or more memories 404, henceforth referred to "memories 404" for brevity. Processors 402 are communicatively coupled to memories 404, as symbolically shown by an arrow 406. Processors 402 and memories 404 may be co-packaged, e.g., on a single circuit board or in a single integrated circuit, or they may be separated from each other. Additionally, in embodiments where processors 402 include a plurality of processors, the plurality of processors need not be co-located but instead could be implemented in a distributed computing environment. Similarly, in embodiments where memories 404 include a plurality of memories, the plurality of memories need not be co-located but instead could be implemented in a distributed storage environment.

Memories 404 include the following stored therein: open circuit voltage instructions 408, setpoint instructions 410, time constant instructions 412, and characteristics instructions 414, where each of the aforesaid instructions is, for example, software and/or firmware. Processors 402 are configured to execute open circuit voltage instructions 408, setpoint instructions 410, time constant instructions 412, and characteristics instructions 414 to perform the functions of open circuit voltage module 128, setpoint module 130, time constant module 132, and characteristics module 134, respectively. Additionally, processors 402 are configured to execute other functions instructions 416, which are, for example, software and/or firmware, to perform other functions 126. Data store 418 is an embodiment of data store 124 (FIG. 1), but contents of data store 418 are not shown in FIG. 2 for illustrative clarity.

Figure 5:
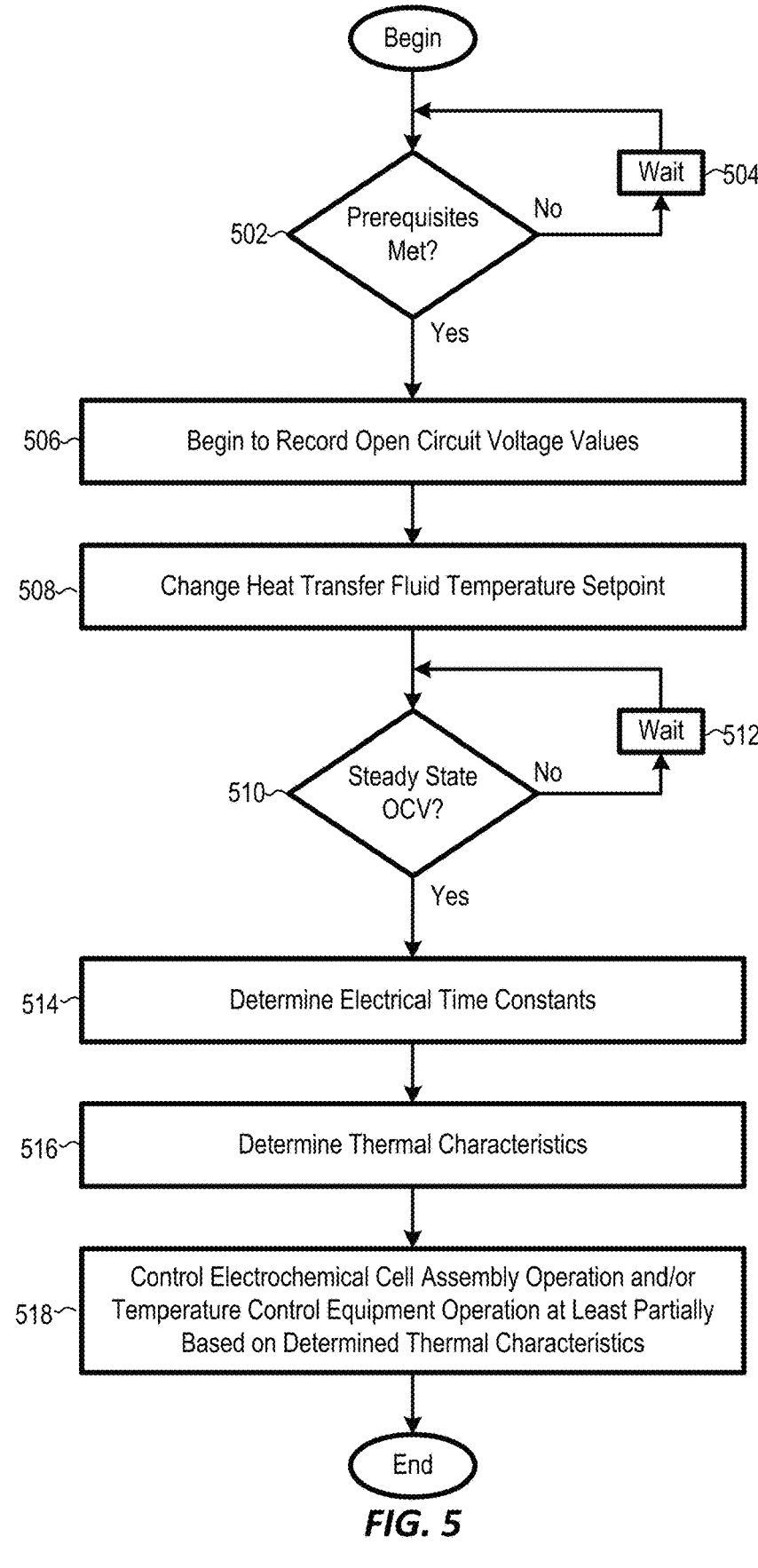
FIG. 5 is a flow chart of a method for determining respective thermal characteristics of a plurality of electrochemical cell assemblies in an energy storage system, according to an embodiment.

FIG. 5 is a flow chart of a method 500 for determining respective thermal characteristics of a plurality of electrochemical cell assemblies in an energy storage system, which is one example of a possible method performed by thermal determination system 106. However, method 500 could be executed by a system other than thermal determination system 106, and method 500 could be adapted for use with energy storage systems other than energy storage system 102.

Method 500 begins with a decision block 502 where open circuit voltage module 128 determines if one or more prerequisites for further execution of method 500 are met. One example of a possible prerequisite of decision block 502 is that each electrochemical cell assembly 108 must operate in a predetermined state for a predetermined time before further execution of method 500. Examples of the predetermined state include, but are not limited to, a predetermined state of charge range where open circuit voltage of an electrochemical cell assembly 108 is a function of temperature of the electrochemical cell assembly 108, a rest state, and/or a predetermined range of voltage Vei, such as to help ensure that differences in open circuit voltages among electrochemical cell assemblies 108 are due to differences in electrochemical cell assembly 108 temperature instead of due to differences in operating states of electrochemical cell assemblies 108. Another example of a possible prerequisite of decision block 502 is that setpoint module 130 must maintain a temperature setpoint of heat transfer fluid 118 for at least a predetermined amount of time, such as to thermally stabilize electrochemical cell assemblies 108, before further execution of method 500.

In some embodiments, open circuit voltage module 128 may cooperate with other functions 126 to control one of more BMS node control 116 to adjust operating states of one or more electrochemical cell assemblies 108 as required to satisfy one or more prerequisites of decision block 502. For example, assume that (i) a prerequisite of decision block 502 is that respective state of charge of each electrochemical cell assembly 108 is within a predetermined state of charge range where open circuit voltage of the electrochemical cell assembly 108 is a function of temperature of the electrochemical cell assembly 108 and (ii) state of charge of electrochemical cell assembly 108(2) is below this predetermined state of charge range. In this example, open circuit voltage module 128 may cooperate with other functions 126 to control BMS node control 116 via control signal c to increase the state of charge of electrochemical cell assembly 108(2) so that it is within the predetermined state of charge range, thereby meeting the prerequisite with respect to electrochemical cell assembly 108(2).

If the result of decision block 502 is no, method 500 proceeds to a block 504 and waits for expiration of a waiting period before returning to block 502. On the other hand, if the result of decision block 502 is yes, method 500 proceeds from decision block 502 to a block 506 where open circuit voltage module 128 (*i*) begins to record open circuit voltages of electrochemical cell assemblies 108 that are received via feedback signals f and (ii) begins to generate a respective voltage profile 136 for each electrochemical cell assembly 108 based on the sensed open circuit voltages of electrochemical cell assemblies 108. Method 500 proceeds from block 506 to a block 508 where setpoint module 130 controls temperature control equipment 112 via signal sp to change a temperature setpoint of heat transfer fluid 118, thereby providing a positive or negative thermal load to electrochemical cell assemblies 108. The change in temperature setpoint of heat transfer fluid 118 may be either an increase in the temperature setpoint or a decrease in the temperature setpoint. While not required, it is anticipated that the temperature setpoint change of block 508 will be a step change, or substantially a step change, in the temperature setpoint of heat transfer fluid 118. In alternate embodiments where temperature control equipment 112 and fluid control infrastructure 114 are replaced with two or more temperature control systems, setpoint module 130 controls respective temperature control equipment of each temperature control system to simultaneously change temperature setpoint of respective heat transfer fluid of each temperature control system.

Method 500 proceeds from block 508 to a decision block 510 where open circuit voltage module 128 determines whether open circuit voltages of electrochemical cell assemblies 108 have stabilized to steady state values after the voltages have changed in response to the change in setpoint of heat transfer fluid 118 of block 508. In some embodiments, open circuit voltage module 128 determines that open circuit voltages of electrochemical cell assemblies 108 have stabilized in response to voltages $V_{cell}$ reaching respective steady-state open circuit values, such as characterized by respective derivatives of voltages $V_{cell}$ with respect to time being less than a predetermined value. In some other embodiments, open circuit voltage module 128 determines that open circuit voltages of electrochemical cell assemblies 108 have stabilized in response to voltages $V_{cell}$ reaching respective stable open circuit voltage patterns. As one example of blocks 506, 508, and 510, consider FIG. 6, which is a graph 600 of magnitude versus time illustrating one example of open circuit voltages of electrochemical cell assemblies 108(1) and 108(2) during blocks 506, 508, and 510 in an example application where (i) electrochemical cell assembly 108(1) is relatively thermally isolated from heat transfer fluid 118, i.e., there is a high thermal resistance between electrochemical cell assembly 108(1) and heat transfer fluid 118, and (ii) electrochemical cell assembly 108(2) is in good thermal contact with heat transfer fluid 118, i.e., there is a low thermal resistance between electrochemical cell assembly 108(2) and heat transfer fluid 118. Graph 600 includes (i) a curve 602 representing temperature setpoint of heat transfer fluid 118, (ii) a curve 604 representing voltage $V_{cell}(1)$, and (iii) a curve 606 representing $V_{cell}(2)$.

In the FIG. 6 example, open circuit voltage module 128 begins to record open circuit voltages of electrochemical cell assemblies 108 at a time to after the one or more prerequisites of decision block 502 are met. As illustrated in graph 600, magnitudes of voltages $V_{cell}(1)$ and $V_{cell}(2)$ are steady and are essentially equal to each other between time to and a time $t_1$. Setpoint module 130 increases the temperature setpoint of heat transfer fluid 118 from a value setpoint_1 to a value setpoint_2 at time $t_1$, causing temperature of heat transfer fluid 118 to increase. The increase in temperature of heat transfer fluid 118 increases temperature of electrochemical cell assemblies 108, which causes respective open circuit voltages of electrochemical cells 108 to drop, as voltage $V_{cell}$ of a given electrochemical cell assembly 108 decreases with increasing temperature of the electrochemical cell assembly 108 in certain state of charge ranges of the electrochemical cell assembly 108. However, open circuit voltage of electrochemical cell assembly 108(1) and open circuit voltage of electrochemical cell assembly 108(2) decrease at difference rates due to the differences in thermal resistance between the electrochemical cell assemblies 108 and heat transfer fluid 118. Specifically, temperature of electrochemical cell assembly 108(2) increases rapidly after time $t_1$ due to electrochemical cell assembly 108(2) being in good thermal contact with heat transfer fluid 118, resulting in rapid drop of open circuit voltage of electrochemical cell assembly 108(2). Conversely, temperature of electrochemical cell assembly 108(1) increases relatively slowly after time $t_1$ due to electrochemical cell assembly 108(1) being relatively thermally isolated from heat transfer fluid 118, resulting in slower drop of open circuit voltage of electrochemical cell assembly 108(1). Accordingly, differences in respective thermal resistances of electrochemical cell assembly 108(1) and electrochemical cell assembly 108(2) with respect to heat transfer fluid 118 are reflected by differences in the open circuit voltage profiles of the two electrochemical cell assemblies 108 after time $t_1$.

At time $t_2$ in the FIG. 6 example, open circuit voltage module 128 determines in decision block 510 that open circuit voltage values of electrochemical cell assemblies 108 have stabilized to steady state values, and open circuit voltage module 128 therefore stops recording open circuit voltage values of electrochemical cell assemblies 108. As such, respective voltage profiles 136 of electrochemical cell assembly 108(1) and electrochemical cell assembly 108(2), which are respectively expressed by curves 604 and 606 in the FIG. 6 example, span a measurement time period $T_m$ extending from time $t_0$ to time $t_2$.

Referring again to FIG. 5, the result of decision block 510 is no, method 500 proceeds to a block 512 and waits for expiration of a waiting period before returning to block 510. Conversely, if the result of decision block 510 is yes, method 500 proceeds from decision block 510 to a block 514 where time constant module 132 determines a respective electrical time constant 138 of each electrochemical cell assembly 108 from the respective voltage profile 136 of the electrochemical cell assembly 108, where each electrical time constant 138 represents time for open circuit voltage of its respective electrochemical cell assembly 108 to change in response to the change of the temperature setpoint of heat transfer fluid 118 in block 508. There are many possible time constant determination procedures that time constant module 132 could use when executing block 514. For example, in certain embodiments, time constant module 132 determines a respective electrical time constant 138 for each electrochemical cell assembly 108 as a time required for open circuit voltage of the electrochemical cell assembly 108 to change by 63.2 percent of a value $V_{step}$, where $V_{step}$ is magnitude of change in open circuit voltage of the electrochemical cell assembly 108 in response to the change of the temperature setpoint of heat transfer fluid 118 in block 508. As another example, in particular embodiments, time constant module 132 performs curve fitting routines to determine a respective electrical time constant 138 for each electrochemical cell assembly 108, such as using a "curve fit" Python Sci_Py function or an analogous function. In one example of block 514 where electrochemical cell assemblies 108(1) and 108(2) have respective voltage profiles 136 as illustrated in FIG. 6, time constant module 132 determines electrical time constants 138(1) and 138(2) of electrochemical cell assemblies 108(1) and 108(2) from curves 604 and 606, respectively. In this example, electrical time constant 138(1) is greater than electrical time constant 138(2) due to greater time required for the open circuit voltage of electrochemical cell assembly 108(1) to stabilize after time $t_1$ than the open circuit voltage of electrochemical cell assembly 108(2), as illustrated in FIG. 6.

Referring again to FIG. 5, method 500 proceeds from block 514 to a block 516 where characteristics module 134 determines a respective thermal characteristic 140 for each electrochemical cell assembly 108 at least partially based on the respective electrical time constant 138 for the electrochemical cell assembly 108. In particular, characteristics module 134 determines a thermal characteristic 140(1) for electrochemical cell assembly 108(1) at least partially based on electrical time constant 138(1) for electrochemical cell assembly 108(1), characteristics module 134 determines a thermal characteristic 140(2) for electrochemical cell assembly 108(2) at least partially based on electrical time constant 138(2) for electrochemical cell assembly 108(2), and so on. Examples of possible respective thermal characteristics 140 of electrochemical cell assemblies 108 determined in block 516 include, but are not limited, thermal time constants, thermal resistances, and R-C thermal models. In some embodiments, thermal characteristics 140 are absolute thermal characteristics, such as absolute thermal time constants, absolute thermal resistances, and/or absolute R-C thermal models. In some other embodiments, thermal characteristics 140 are relative thermal characteristics, such as relative thermal time constants, relative thermal resistances, and/or relative thermal models. In particular embodiments, characteristics module 134 generates relative thermal characteristics 140 by normalizing each thermal characteristic 140 determined in block 516 with respect to a reference thermal characteristic, such a largest thermal characteristic 140 determined in block 516 or a smallest thermal characteristic 140 determined in block 516.

In one example of block 516, the respective thermal characteristic for each electrochemical cell assembly 108 is a respective thermal time constant for the electrochemical cell assembly 108, and characteristics module 134 sets the respective thermal time constant for the electrochemical cell assembly 108 equal to the electrochemical cell assembly 108's respective electrical time constant 138, in view of an electrical time constant for an electrochemical cell being approximately equal to a thermal time constant for an electrochemical cell. In another example of block 516, the respective thermal characteristic for each electrochemical cell assembly 108 is a respective thermal resistance for the electrochemical cell assembly 108, and characteristics module 134 sets the respective thermal resistance for the electrochemical cell assembly 108 equal to a scaled value of the electrochemical cell assembly 108's respective electrical time constant 138, in view of thermal resistance increasing with an increasing value of an electrical time constant determined in block 514.

As an additional example of block 516, the respective thermal characteristic for each electrochemical cell assembly 108 is a respective R-C thermal model for the electrochemical cell assembly 108, and characteristics module 134 generates the respective R-C thermal model for the electrochemical cell assembly 108 based on the electrochemical cell assembly 108's respective electrical time constant 138. FIG. 7A is a schematic diagram of a thermal environment 700 including a box symbolically representing heat transfer fluid 118, a box symbolically representing electrochemical cell assembly 108(1), and a box symbolically representing a thermal interface 702 between electrochemical cell assembly 108(1) and heat transfer fluid 118. Thermal interface 702 is part of fluid control infrastructure 114, and thermal interface 702 includes, for example, a heat exchanger, electrical isolation material that is thermally conductive, free space between electrochemical cell assembly 108(1) and a channel, duct, pipe, or the like carrying heat transfer fluid 118, etc. FIG. 7B illustrates an R-C thermal model 704 of thermal environment 700, where R-C thermal model 704 represents delay in transfer of heat 706 (FIG. 7A) from electrochemical cell assembly 108(1) to heat transfer fluid 118. R-C thermal model 704 is one example of an R-C thermal model generated by characteristics module 134. R-C thermal model 704 includes a resistor 708 and a capacitor 710. Resistor 708 represents a combination of (i) a thermal resistance $R_1$ of electrochemical cell assembly 108(1) and a (ii) a thermal resistance $R_2$ of thermal interface 702. Resistor 708 could be replaced with two resistors connected in series that respectively represent thermal resistance $R_1$ and thermal resistance $R_2$. Analogously, capacitor 710 represents a combination of (i) a thermal capacitance $C_1$ electrochemical cell assembly 108(1) and a (ii) a thermal capacitance $C_2$ of thermal interface 702. Capacitor 710 could be replaced with two capacitors connected in parallel that respectively represent thermal capacitance $C_1$ and thermal capacitance $C_2$.

It should be noted that R-C thermal model 704 is based on actual thermal characteristics of electrochemical cell assembly 108(1) and its environment as determined by thermal determination system 106, instead of being based on a nominal electrochemical cell. As such, R-C thermal model 704 may more accurately model electrochemical cell assembly 108(1) than a model based on nominal thermal characteristics of electrochemical cells 108.

Referring again to FIG. 5, method 500 optionally further includes a block 518 after block 516. In optional block 518, controller 104 controls electrochemical cell assembly 108 operation and/or temperature control equipment 112 operation at least partially based on one or more of the thermal characteristics determined block 516. For example, other functions 126 may control BMS node control 116 via control signals c to individually control charging and/or discharging of one or more electrochemical cell assemblies 108 based on respective thermal characteristics 140 of the electrochemical cell assemblies. For instance, other functions 126 may decrease charging of an electrochemical cell assembly 108 in response to a respective thermal characteristic 140 indicating that the electrochemical cell assembly 108 is prone to overheating. As another example, setpoint module 130 may control temperature control equipment 112 via signal sp at least partially based on or more thermal characteristics 140.

Method 500 may achieve the most accurate values of thermal characteristics 140 when electrochemical cell assemblies 108 are substantially thermally isolated from each other. Fortunately, energy storage systems are increasingly being designed with large intra-cell thermal resistance, i.e., with high thermal resistances between electrochemical cells, to mitigate thermal propagation from electrochemical cell to electrochemical cell in the energy storage system. As such, it is anticipated that accuracy of method 500 in determining thermal characteristics 140 will increase with newer energy storage system designs.

Referring again to FIG. 1, temperature of heat transfer fluid 118 may vary along fluid control infrastructure 114, such as due to heat transfer between electrochemical cell assemblies 108 and/or heat transfer between heat transfer fluid 118 and an environment of energy storage system 102. For example, temperature of heat transfer fluid 118 at a location 142 along fluid control infrastructure 114 may be different from temperature of heat transfer fluid 118 at a location 144 along fluid control infrastructure 114, such as due to heating of heat transfer fluid 118 by electrochemical cell assemblies 108 between locations 142 and 144. Difference in temperature of heat transfer fluid 118 between locations along fluid control infrastructure 114 may be linearly or non-linearly related to distance between locations, as well as be linearly or non-linearly related to time. Certain embodiments of time constant module 132 are configured to at least partially compensate for difference in temperature of heat transfer fluid 118 among electrochemical cell assemblies 108 when determining electrical time constants 138.

For example, certain embodiments of time constant module 132 are configured to use EQN. 1 below to determine electrical time constants 138, where OCV is open circuit voltage of an electrochemical cell assembly 108, t is time, i is an index ranging from 1 to N that identifies a particular electrochemical cell assembly 108 in energy storage system 102, $OCV_{gndinitial,i}$ is open circuit voltage of an $i^{th}$ electrochemical cell assembly 108 at an initial temperature of heat transfer fluid 118 at a location of the $i^{th}$ electrochemical cell assembly 108, $\tau_{ocvgnd,i}$ is an open circuit voltage time constant of an $i^{th}$ electrochemical cell assembly 108 and corresponds to decaying temperature of heat transfer fluid 118 at a location of the $i^{th}$ electrochemical cell assembly 108, and $\tau_{ovc,i}$ is an electrical time constant 138 for an $i^{th}$ electrochemical cell assembly 108. $OCV_{gndinitial,i}$, $\tau_{ocvgnd,i}$, and $\tau_{ovc,i}$ are unknown terms in EQN. 1. In particular embodiments, time constant module 132 is configured to estimate upper and lower bounds for all three unknown terms and solve for the three unknown terms using a curve fitting process or an analogous process.

$$OCV(t, i) =$$

(EQN. 1)

$$OCV_{final,i} + (OCV_{gndinitial,i} - OCV_{final,i}) * e^{\frac{-t}{\tau_{ocvgnd,i}}} + \left[ OCV_{initial,i} - \right.$$

$$\left. OCV_{final,i} - (OCV_{gndinitial,i} - OCV_{final,i}) * e^{\frac{-t}{\tau_{ocvgnd,i}}} \right] * e^{\frac{-t}{\tau_{ocv,i}}}$$

Figure 8:
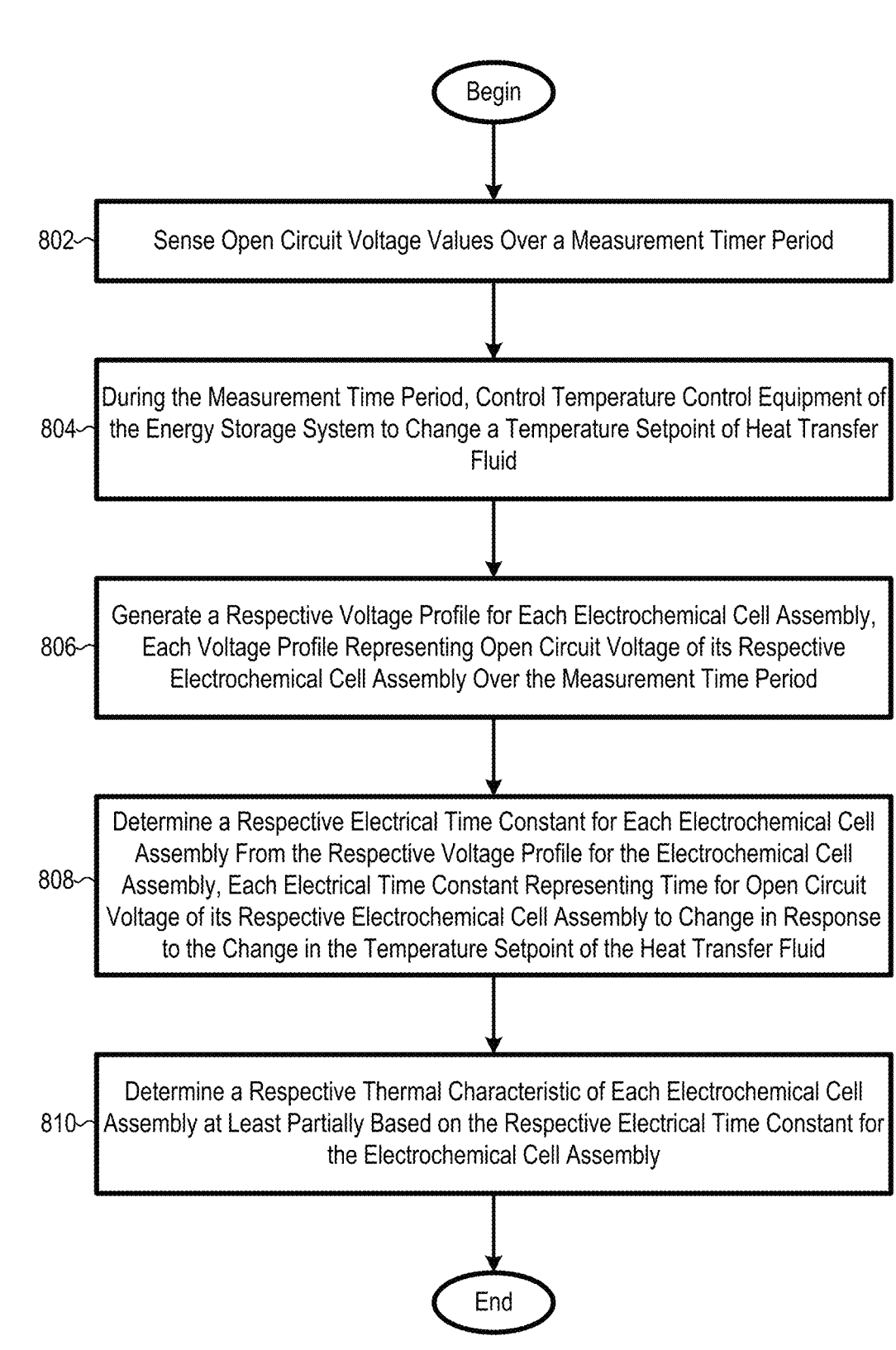
FIG. 8 is a flow chart of another method for determining respective thermal characteristics of a plurality of electrochemical cell assemblies in an energy storage system, according to an embodiment.

FIG. 8 is a flow chart of a method 800 for determining respective thermal characteristics of a plurality of electrochemical cell assemblies in an energy storage system, which is another example of a method performed by thermal determination system 106. However, method 800 could be executed by a system other than thermal determination system 106, and method 800 could be adapted for use with energy storage systems other than energy storage system 102.

In a block 802 of method 800, open circuit voltage module 128 senses open circuit voltage of each electrochemical cell assembly 108 over a measurement time period. In one example of block 802, open circuit voltage module 128 senses open circuit voltage of each electrochemical cell assembly 108 over measurement time period $T_m$ of FIG. 6 using data received from sensing elements 110 via feedback signals f. Method 800 proceeds from block 802 to a block 804 where setpoint module 130 changes a temperature setpoint of heat transfer fluid 118 during the measurement time period of block 802. In one example of block 804, setpoint module 130 changes the temperature setpoint of heat transfer fluid 118 at time $t_1$ from setpoint_1 to setpoint_2, as illustrated in FIG. 6. Method 800 proceeds from block 804 to a block 806 where open circuit voltage module 128 generates a respective voltage profile for each electrochemical cell assembly 108, where each open circuit voltage profile represents open circuit voltage of its respective electrochemical cell assembly 108 over the measurement time period. In one example of block 806, open circuit voltage module 128 generates a respective voltage profile 136 for each electrochemical cell assembly 108 from the open circuit voltage values sensed in block 802.

Method 800 proceeds from block 806 to a block 808 where time constant module 132 determines a respective electrical time constant for each electrochemical cell assembly 108 from the respective voltage profile for the electrochemical cell assembly generated in block 806, where each electrical time constant represents time for open circuit voltage of its respective electrochemical cell assembly 108 to change in response to the change of the temperature setpoint of the heat transfer fluid in block 804. In one example of block 808, time constant module 132 determines a respective electrical time constant 138 for each electrochemical cell assembly 108 from the respective voltage profile 136 of the electrochemical cell assembly 108, such as using one or more of the techniques discussed above with respect to block 514 of method 500. Method 800 proceeds from block 808 to a block 810 where characteristics module 134 determines a respective thermal characteristic for each electrochemical cell assembly 108 at least partially based on the respective electrical time constant for the electrochemical cell assembly 108. In one example of block 810, characteristics module 134 determines a respective thermal characteristic 140 for each electrochemical cell assembly 108 at least partially based on the respective electrical time constant 138 for the electrochemical cell assembly 108, where each thermal characteristic 140 is one of the thermal characteristics discussed above with respect to block 516 of method 500.

FIG. 9 is a flow chart of a method 900 for determining respective thermal characteristics of a plurality of electrochemical cell assemblies in an energy storage system, which is an additional example of a method performed by thermal determination system 106. However, method 900 could be executed by a system other than thermal determination system 106, and method 900 could be adapted for use with energy storage systems other than energy storage system 102.

In a block 902 of method 900, open circuit voltage module 128 begins, at a first time, recording of respective open circuit voltages of the plurality of electrochemical cells assemblies 108. In one example of block 902, open circuit voltage module 128 begins recording open circuit voltages of electrochemical cell assemblies 108 at time to as illustrated in FIG. 6, based on data received from feedback signals f. Method 900 proceeds from block 902 to a block 904 where, at a time that is after the first time but before a second time, setpoint module 130 controls temperature control equipment 112 to change a temperature setpoint of heat transfer fluid 118. In one example of block 904, setpoint module 130 changes the temperature setpoint of heat transfer fluid 118 at time $t_1$ from setpoint_1 to setpoint_2, where time $t_1$ is after time to but is before time $t_2$, as illustrated in FIG. 6. Method 900 proceeds from block 904 to a block 906 where open circuit voltage module 128 ends recording of open circuit voltages of electrochemical cell assemblies 108 at the second time. In one example of block 906, open circuit voltage module 128 ends recording of open circuit voltages of electrochemical cell assemblies 108 at time $t_2$, as illustrated in FIG. 6.

Method 900 proceeds from block 906 to a block 908 where open circuit voltage module 128 generates a respective voltage profile for each electrochemical cell assembly 108 from the open circuit voltage of the electrochemical cell assembly 108 recorded from the first time to the second time. In one example of block 908, open circuit voltage module 128 generates a respective voltage profile 136 for each electrochemical cell assembly 108 based on respective open circuit voltages of electrochemical cell assemblies 108 recorded from time $t_0$ to time $t_2$ of FIG. 6, based on data received from feedback signals f. Method 900 proceeds from block 908 to a block 910 where time constant module 132 determines a respective electrical time constant for each electrochemical cell assembly 108 from the respective voltage profile for the electrochemical cell assembly 108 generated in block 908, where each electrical time constant represents time for open circuit voltage of its respective electrochemical cell assembly 108 to change in response to the change of the temperature setpoint of the heat transfer fluid in block 904. In one example of block 910, time constant module 132 determines a respective electrical time constant 138 for each electrochemical cell assembly 108 from the respective voltage profile 136 of the electrochemical cell assembly 108, such as using one or more of the techniques discussed above with respect to block 514 of method 500. Method 900 proceeds from block 910 to a block 912 where characteristics module 134 determines a respective thermal characteristic for each electrochemical cell assembly 108 at least partially based on the respective electrical time constant for the electrochemical cell assembly 108. In one example of block 912, characteristics module 134 determines a respective thermal characteristic 140 for each electrochemical cell assembly 108 at least partially based on the respective electrical time constant 138 for the electrochemical cell assembly 108, where each thermal characteristic 140 is one of the thermal characteristics discussed above with respect to block 516 of method 500.

Referring again to FIG. 1, in particular embodiments, the N electrochemical cell assemblies 108 are distributed among a plurality of energy storage assemblies in energy storage system 102. Each of the energy storage assemblies is, for example, a module of energy storage system 102, a rack of energy storage system 102, a stack of energy storage system 102, or a container of energy storage system 102. For example, FIG. 10 is a schematic diagram of an electrical environment 1000, which is an embodiment of electrical environment 100 of FIG. 1 where (i) energy storage system 102 is embodied by an energy storage system 1002 and (ii) controller 104 is embodied by a controller 1004. Electrochemical cell assemblies 108 are distributed among two energy storage assemblies 1008 in energy storage system 1002, where each energy storage assembly 1008 is, for example, a module, a rack, a stack, or a container. Temperature control equipment 112 and fluid control infrastructure 114 are not shown in FIG. 10 for illustrative clarity, although it is understood that each electrochemical cell assembly 108 of each energy storage assembly 1008 is in thermal communication with heat transfer fluid 118 via fluid control infrastructure 114, as discussed above with respect to FIG. 1. Additionally, while sensing elements 110 and BMS node control 116 are not shown in FIG. 10 for illustrative clarity, it is understood that these elements are included in energy storage system 1002. While energy storage system 1002 is illustrated as including two energy storage assemblies 1008, the quantity of energy storage assemblies 1008 of energy storage system 1002 may vary as a design choice.

Figure 11:
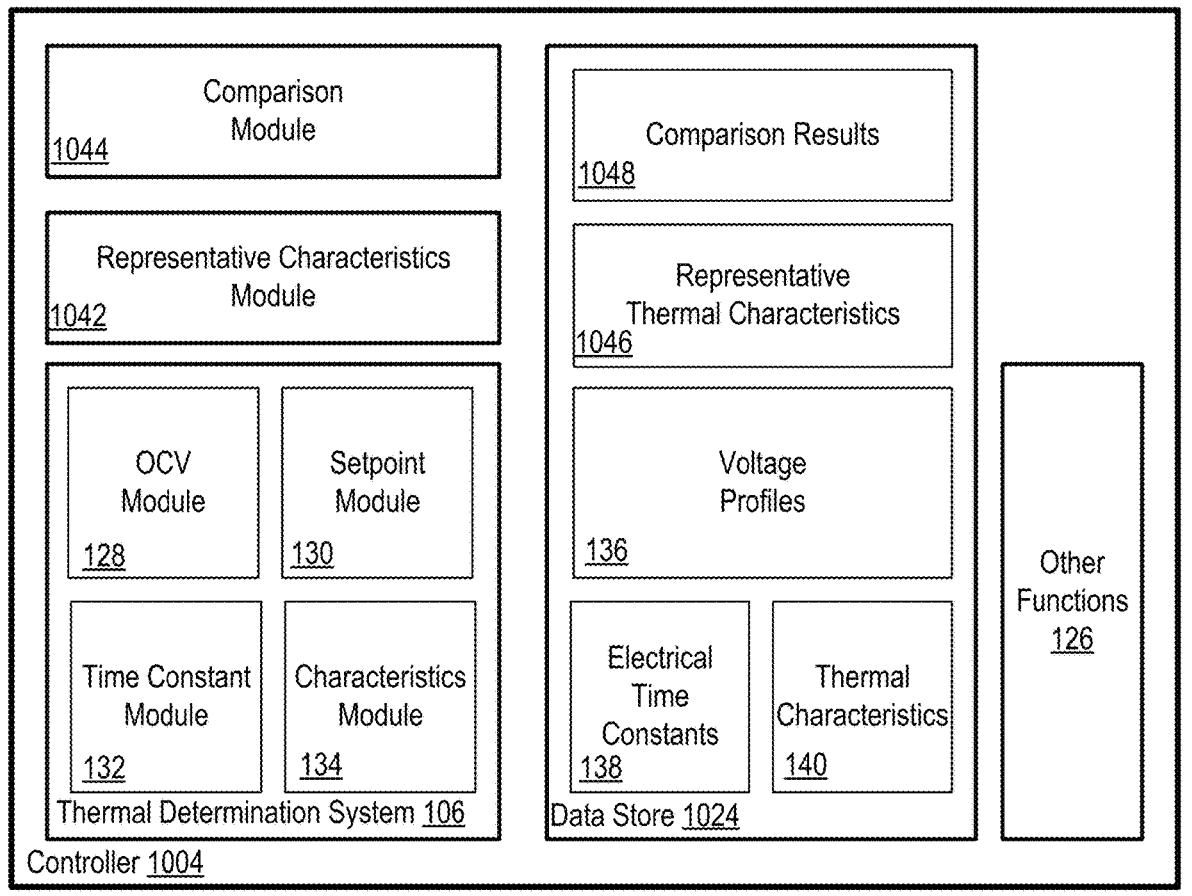
FIG. 11 is a block diagram of a controller of the FIG. 10 electrical environment.

Controller 1004 is an alternate embodiment of controller 104, and FIG. 11 is a block diagram of controller 1004 showing the controller in more detail than in FIG. 10. Controller 1004 includes a representative characteristics module 1042 and a comparison module 1044 in addition to the elements of controller 104. Additionally, data store 124 is replaced with a data store 1024 which includes representative thermal characteristics 1046 and comparison results 1048 in addition to the elements of data store 124. Representative characteristics module 1042 and comparison module 1044 are implemented, for example, by analog and/or digital electronic circuitry. For example, in some embodiments, representative characteristics module 1042 and comparison module 1044 are at least partially implemented by one or more processors executing non-transitory instructions, such as software and/or firmware, stored in one or more memories or other storage elements, such as in a manner analogous to that discussed above with respect to FIG. 4. Operation of representative characteristics module 1042 and comparison module 1044 is discussed below. In some alternate embodiments, controller 1004 includes only one of representative characteristics module 1042 and comparison module 1044 instead of both of representative characteristics module 1042 and comparison module 1044.

Referring again to FIG. 10, each energy storage assembly 1008 includes a plurality of electrochemical cell assemblies 108 disposed in a matrix of rows $R_1$ through $R_4$ and columns $C_1$ through $C_4$. For example, electrochemical cell assembly 108(7) is disposed at a location in energy storage assembly 1008(1) identified as row $R_2$ and column $C_3$. As another example, electrochemical cell assembly 108(26) is disposed at a location in energy storage assembly 1008(2) identified as row $R_3$ and column $C_2$. The quantity of rows of each energy storage assembly 1008, as well as the quantity of columns of each energy storage assembly 1008, may vary as a design choice. Additionally, the quantity of electrochemical cell assemblies 108 of each energy storage assembly 1008 may vary as a design choice. Furthermore, the energy storage assemblies 1008 of energy storage system 1002 need not have identical configurations. For example, the quantity of electrochemical cell assemblies 108 per energy storage assembly 1008 may vary across two or more energy storage assemblies 1008. Moreover, one or more energy storage assemblies 1008 could be modified so that electrochemical cell assemblies 108 are disposed in the energy storage assembly 1008 in three dimensions instead of in two dimensions.

Particular embodiments of representative characteristics module 1042 are configured to determine a representative thermal characteristic 1046 of each energy storage assembly 1008 at least partially based on the respective thermal characteristics 140 of the electrochemical cell assemblies 108 included in the energy storage assembly 1008. For example, in particular embodiments, representative characteristics module 1042 is configured to (i) determine a representative thermal characteristic 1046(1) for energy storage assembly 1008(1) at least partially based on respective thermal characteristics of electrochemical cell assemblies 108(1) through 108(16) and (ii) determine a representative thermal characteristic 1046(2) for energy storage assembly 1008(2) at least partially based on respective thermal characteristics of electrochemical cell assemblies 108(17) through 108(32). In certain embodiments, each representative thermal characteristic 1046 is one of an average thermal characteristic of the electrochemical cell assemblies 108 included in the energy storage assembly 1008, a mean thermal characteristic of the electrochemical cell assemblies 108 included in the energy storage assembly 1008, a minimum thermal characteristic of the electrochemical cell assemblies 108 included in the energy storage assembly 1008, and a maximum thermal characteristic of the electrochemical cell assemblies 108 included in the energy storage assembly 1008.

Some embodiments of controller 1004 are configured to control operation of energy storage system 1002 at least partially based on representative thermal characteristics 1046. For example, in certain embodiments, other functions 126 are configured to control charging and/or discharging of the electrochemical cell assemblies 108 included in each energy storage assembly 1008 at least partially based on the respective representative thermal characteristic 1046 of the energy storage assembly 1008. For instance, in some embodiments, other functions 126 are configured to control one or more of (ii) rate of charging or discharging of the electrochemical cell assemblies 108 included in each energy storage assembly 1008, (ii) a minimum state of charge value of the electrochemical cell assemblies 108 included in each energy storage assembly 1008, and (iii) a maximum state of charge value of the electrochemical cell assemblies 108 included in each energy storage assembly 1008, at least partially based on the respective representative thermal characteristic 1046 of the energy storage assembly 1008.

Certain embodiments of comparison module 1044 are configured to compare respective thermal characteristics 140 of two or more electrochemical cell assemblies 108 having a common location in their respective energy storage assemblies 1008 and generate a comparison result 1048 representing a result of the comparison. Each comparison result 1048 represents, for example, a comparison of respective thermal time constants of two or more electrochemical cell assemblies 108 having a common location in their respective energy storage assemblies 1008, a comparison of respective thermal resistances of two or more electrochemical cell assemblies 108 having a common location in their respective energy storage assemblies 1008, or a comparison of respective R-C models of two or more electrochemical cell assemblies 108 having a common location in their respective energy storage assemblies 1008. Each comparison result 1048 is expressed, for example, as one or more ratios of respective thermal characteristics of two electrochemical cell assemblies 108, one or more ratios of respective thermal characteristics of electrochemical cell assemblies 108 that have been normalized with respect to the thermal characteristics of one electrochemical cell assembly 108 included in the comparison, etc. The common location is, for example, a common row and a common column in their respective energy storage assemblies 1008. For example, in certain embodiments, comparison module 1044 compares respective thermal characteristics 140 of electrochemical cell assemblies 108(10) and 108(26) that are each located in row $R_3$ and column $C_2$ of their respective energy storage assembly 1008. As another example, in some embodiments, comparison module 1044 compares respective thermal characteristics 140 of electrochemical cell assemblies 108(16) and 108(32) that are each located in row $R_4$ and column $C_4$ of their respective energy storage assembly 1008.

Energy storage system 1002 could be modified so that the N electrochemical cell assemblies 108 are distributed among two or more different types of energy storage assemblies, such as among a hierarchy of energy storage assemblies. For example, FIG. 12 is a block diagram of an energy storage system 1200, which is an alternate embodiment of energy storage system 1002 of FIG. 10 including a plurality of containers 1202, where (i) each container 1202 includes J stacks 1204 where J is an integer greater than one, (ii) each stack 1204 includes M racks 1206 where M is an integer greater than one, (iii) each rack 1206 includes N modules 1208 where N is an integer greater than one, and (iv) each module 1208 includes a plurality of electrochemical cell assemblies 108 (not shown in FIG. 12 for illustrative clarity). Controller 1004 is not shown in FIG. 12 for illustrative clarity. Although FIG. 12 shows energy storage system 1200 as including two containers 1202, the quantity of containers 1202 in energy storage system 1200 may vary as a design choice. In particular embodiments, the electrochemical cell assemblies 108 of each module 1208 are disposed in a matrix of rows and columns in a manner similar to how electrochemical cell assemblies 108 are disposed in rows and columns in energy storage assemblies 1008 of FIG. 10. Additionally, in particular embodiments, modules 1208 are disposed in different respective columns in each rack 1206, racks 1206 are disposed in different respective rows in each stack 1204, and stacks 1204 are disposed in different respective columns in each container 1202.

In certain embodiments of energy storage system 1200, representative characteristics module 1042 is configured to determine one or more of (i) a representative thermal characteristic 1046 of each module 1208 at least partially based on the respective thermal characteristics 140 of the electrochemical cell assemblies 108 included in the module 1208, (ii) a representative thermal characteristic 1046 of each rack 1206 at least partially based on the respective thermal characteristics 140 of the electrochemical cell assemblies 108 included in the rack 1206, (iii) a representative thermal characteristic 1046 of each stack 1204 at least partially based on the respective thermal characteristics 140 of the electrochemical cell assemblies 108 included in the stack 1204, and (iv) a representative thermal characteristic 1046 of each container 1202 at least partially based on the respective thermal characteristics 140 of the electrochemical cell assemblies 108 included in the container 1202.

Additionally, some embodiments are configured to control operation of energy storage system 1200 at least partially based on any one or more of the representative thermal characteristics 1046 of energy storage system 1200. For example, in certain embodiments, other functions 126 are configured to control one or more of (i) charging and/or discharging of the electrochemical cell assemblies 108 of each module 1208 at least partially based on the respective representative thermal characteristic 1046 of the module 1208, (ii) charging and/or discharging of the electrochemical cell assemblies 108 of each rack 1206 at least partially based on the respective representative thermal characteristic 1046 of the rack 1206, (iii) charging and/or discharging of the electrochemical cell assemblies 108 of each stack 1204 at least partially based on the respective representative thermal characteristic 1046 of the stack 1204 and (iv) charging and/or discharging of the electrochemical cell assemblies 108 of each container 1202 at least partially based on the respective representative thermal characteristic 1046 of the container 1202.

Additionally, in some embodiments of energy storage system 1200, comparison module 1044 is configured to perform one or more of the following comparisons and generate associated comparison results 1048: (i) compare respective thermal characteristics 140 of two or more containers 1202, (ii) compare respective thermal characteristics 140 of two or more stacks 1204 having a common location in their respective containers 1202, (iii) compare respective thermal characteristics 140 of two or more racks 1206 having a common location in their respective stacks 1204, and (iv) compare respective thermal characteristics 140 of two or more modules 1208 having a common location in their respective racks 1206.

Referring again to FIG. 11, representative characteristics module 1042 and comparison module 1044 could also be implemented in a controller that includes an alternative system for determining thermal characteristics of electrochemical cells. For example, FIG. 13 is a schematic diagram of an electrical environment 1300, which is an alternate embodiment of electrical environment 1000 (FIG. 10) including (i) an energy storage system 1302 in place of energy storage system 1002 and (ii) a controller 1304 in place of controller 1004. Energy storage system 1302 includes energy storage assemblies 1308 in place of energy storage assemblies 1008. Energy storage assembly 1308(1) is like energy storage system 1008(1) except that energy storage assembly 1308(1) further includes temperature sensing devices 1342, symbolically shown as a single thermistor, configured to measure respective temperatures of electrochemical cell assemblies 108(1) through 108(16). Similarly, energy storage assembly 1308(2) is like energy storage system 1008(2) except that energy storage assembly 1308(2) further includes temperature sensing devices 1344, symbolically shown as a single thermistor, configured to measure respective temperatures of electrochemical cell assemblies 108(17) through 108(32). Similar to energy storage system 1002 of FIG. 10, energy storage system 1302 includes BMS node control 116, temperature control equipment 112, and fluid control infrastructure 114, but these elements are not shown for illustrative clarity. Sensing elements 110 (not shown) are optionally omitted from energy storage system 1302.

Figure 14:
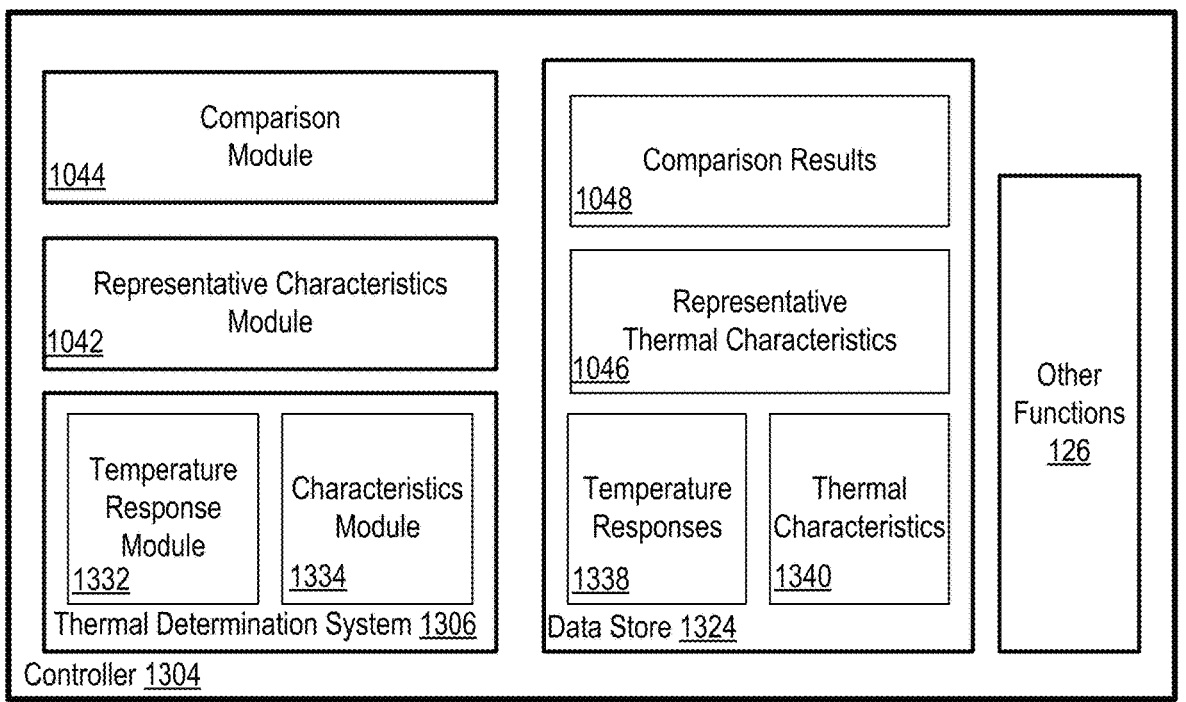
FIG. 14 is a block diagram of a controller of the FIG. 13 electrical environment.

FIG. 14 is a block diagram of controller 1304 which includes (i) a thermal determination system 1306 in place of thermal determination system 106 and a data store 1324 in place of data store 124. Thermal determination system 1306 includes a temperature response module 1332 and a characteristics module 1334. In certain embodiments, each of temperature response module 1332 and characteristics module 1334 is at least partially implemented by one or more processors executing non-transitory instructions, such as software and/or firmware, stored in one or more memories or other storage elements, such as in a manner analogous to that discussed above with respect to FIG. 4. Data store 1324 includes temperature responses 1338 and thermal characteristics 1340 in addition to representative thermal characteristics 1046 and comparison results 1048. Temperature response module 1332 is configured to determine a respective temperature response 1338 of each electrochemical cell assembly 108 in response to a known thermal load, such as in response to (i) a known change in temperature of heat transfer fluid 118 or (ii) energy storage system 1302 being switching between an operating mode and an idle mode, at least partially based on signals from temperature sensing devices 1342 and temperature sensing devices 1344. Characteristics module 1334 is configured to determine a respective thermal characteristic 1340 for each electrochemical cell assembly 108 at least partially based on the respective temperature response 1338 for the electrochemical cell assembly 108, where each thermal characteristic 1340 includes, for example, one or more of an absolute thermal resistance, a relative thermal resistance, an absolute thermal time constant, a relative thermal time constant, an R-C thermal model of the electrochemical cell assembly, etc. Representative characteristics module 1042 and comparison module 1044 operate as discussed above except that they use thermal characteristics 1340 in place of thermal characteristics 140.

Figure 16:
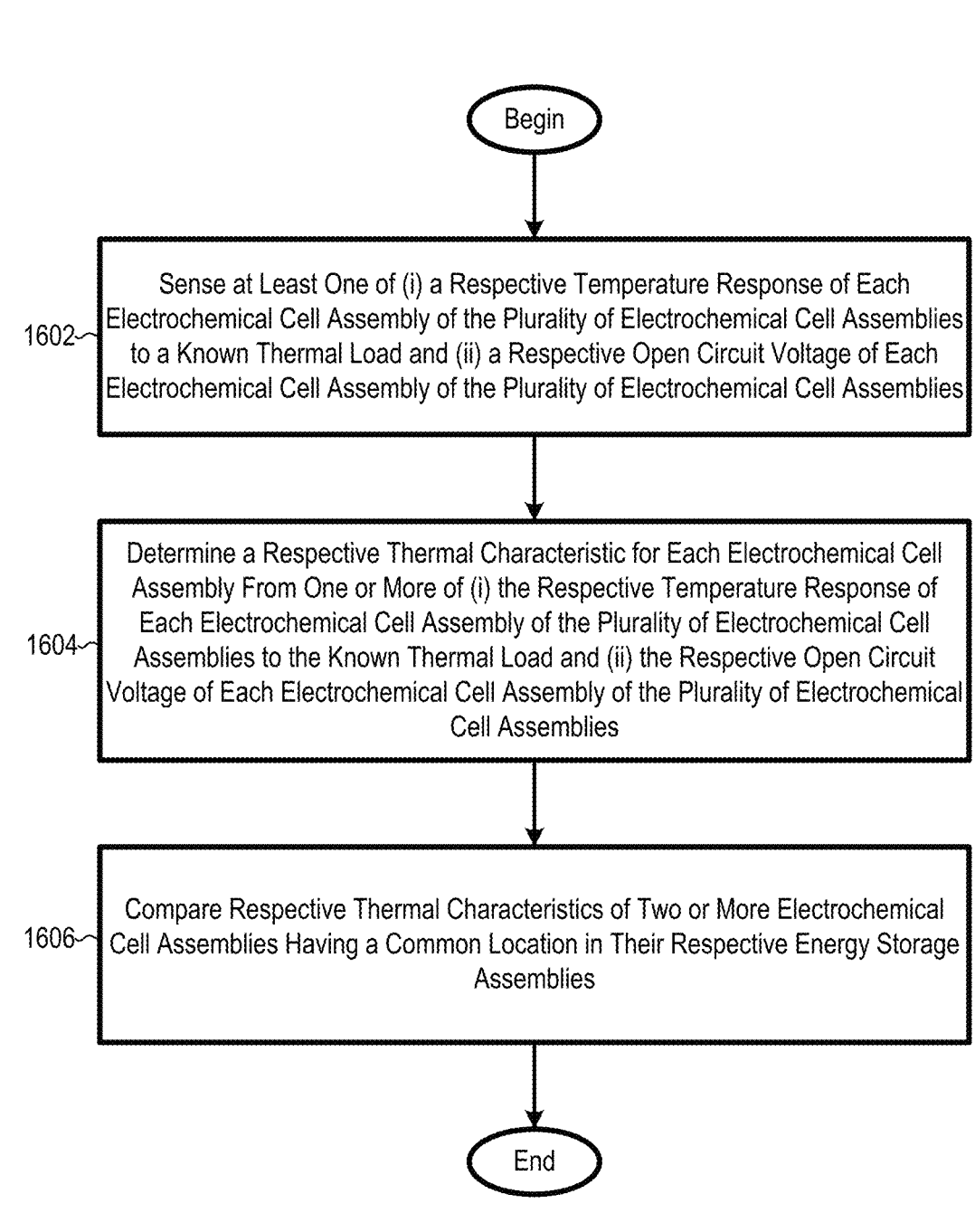
FIG. 16 is a flow chart of another method for evaluating thermal performance of an energy storage system including a plurality of electrochemical cell assemblies, according to an embodiment.

Discussed below with respect to FIGS. 15 and 16 are two example operating methods of controllers 1004 and 1304. However, it is understood that controllers 1004 and 1304 are not limited to operating according to the examples of FIGS. 15 and 16. Additionally, the example methods of FIGS. 15 and 16 could be implemented by controllers other than controllers 1004 and 1304.

FIG. 15 is a flow chart of a method 1500 for evaluating thermal performance of an energy storage system including a plurality of electrochemical cell assemblies, where the plurality of electrochemical cell assemblies is distributed among a plurality of energy storage assemblies in the energy storage system such that each energy storage assembly includes a respective two or more electrochemical cell assemblies of the plurality of electrochemical cell assemblies. In a block 1502 of method 1500, at least one of the following is sensed: (i) a respective temperature response of each electrochemical cell assembly of the plurality of electrochemical cell assemblies to a known thermal load and (ii) a respective open circuit voltage of each electrochemical cell assemblies of the plurality of electrochemical cell assemblies. In one example of block 1502, open circuit voltage module 128 of controller 1004 senses a respective open circuit voltage of each electrochemical cell assembly 108 of energy storage system 1002 or 1200 after (i) setpoint module 130 changes a temperature setpoint of heat transfer fluid 118. In another example of block 1502, temperature response module 1332 senses a respective temperature response 1338 of each electrochemical cell assembly 108 of energy storage system 1302 in response to (i) a known change in temperature of heat transfer fluid 118 or (ii) energy storage system 1302 switching between an operating mode and an idle mode.

Method 1500 proceeds from block 1502 to a block 1504 where a respective thermal characteristic is determined from one or more of (i) the respective temperature response of each electrochemical cell assembly of the plurality of electrochemical cell assemblies to the known thermal load and (ii) the respective open circuit voltage of each electrochemical cell assembly of the plurality of electrochemical cell assemblies. In one example of block 1504, (i) time constant module 132 determines a respective electrical time constant 138 for each electrochemical cell assembly 108 of energy storage system 1002 or 1200 from the respective voltage profile 136 for the electrochemical cell assembly 108 and (ii) characteristics module 134 determines a respective thermal characteristic 140 for each electrochemical cell assembly 108 from the respective electrical time constant 138 for the electrochemical cell assembly 108. In another example of block 1504, characteristics module 1334 determines a respective thermal characteristic 1340 for each electrochemical cell assembly 108 of energy storage system 1302 based on the respective temperature response 1338 of the electrochemical cell assembly 108.

Method 1500 proceeds from block 1504 to a block 1506 where a respective representative thermal characteristic is determined for each energy storage assembly based on the respective thermal characteristics of the electrochemical cell assemblies included in the energy storage assembly. In one example of block 1506, representative characteristics module 1042 of controller 1004 determines a representative thermal characteristic 1046 of each energy storage assembly 1008 of energy storage system 1002 at least partially based on the respective thermal characteristics 140 of the electrochemical cell assemblies 108 included in the energy storage assembly 1008. In another example of block 1506, representative characteristics module 1042 of controller 1004 determines one or more of (i) a representative thermal characteristic 1046 of each module 1208 of energy storage system 1200 at least partially based on the respective thermal characteristics 140 of the electrochemical cell assemblies 108 included in the module 1208, (ii) a representative thermal characteristic 1046 of each rack 1206 of energy storage system 1200 at least partially based on the respective thermal characteristics 140 of the electrochemical cell assemblies 108 included in the rack 1206, (iii) a representative thermal characteristic 1046 of each stack 1204 of energy storage system 1200 at least partially based on the respective thermal characteristics 140 of the electrochemical cell assemblies 108 included in the stack 1204, and (iv) a representative thermal characteristic 1046 of each container 1202 of energy storage system 1200 at least partially based on the respective thermal characteristics 140 of the electrochemical cell assemblies 108 included in the container 1202. In an additional example of block 1506, representative characteristics module 1042 of controller 1304 determines a representative thermal characteristic 1046 of each energy storage assembly 1308 of energy storage system 1302 at least partially based on the respective thermal characteristics 1340 of the electrochemical cell assemblies 108 included in the energy storage assembly 1308.

FIG. 16 is a flow chart of method 1600 for evaluating thermal performance of an energy storage system including a plurality of electrochemical cell assemblies, where the plurality of electrochemical cell assemblies is distributed among a plurality of energy storage assemblies in the energy storage system such that each energy storage assembly includes a respective two or more electrochemical cell assemblies of the plurality of electrochemical cell assemblies. In a block 1602 of method 1600, at least one of the following is sensed: (i) a respective temperature response of each electrochemical cell assembly of the plurality of electrochemical cell assemblies to a known thermal load and (ii) a respective open circuit voltage of each electrochemical cell assembly of the plurality of electrochemical cell assemblies. In one example of block 1602, open circuit voltage module

128 of controller 1004 senses a respective open circuit voltage of each electrochemical cell assembly 108 of energy storage system 1002 or 1200 after setpoint module 130 changes a temperature setpoint of heat transfer fluid 118. In another example of block 1602, temperature response module 1332 senses a respective temperature response 1338 of each electrochemical cell assembly 108 of energy storage system 1302 in response to a known change in temperature of heat transfer fluid 118 or in response to energy storage system 1302 switching between an operating mode and an idle mode.

Method 1600 proceeds from block 1602 to a block 1604 where a respective thermal characteristic is determined from one or more of (i) the respective temperature response of each electrochemical cell assembly of the plurality of electrochemical cell assemblies to the known thermal load and (ii) the respective open circuit voltage of each electrochemical cell assembly of the plurality of electrochemical cell assemblies. In one example of block 1604, (i) time constant module 132 determines a respective electrical time constant 138 for each electrochemical cell assembly 108 of energy storage system 1002 or 1200 from the respective voltage profile 136 for the electrochemical cell assembly 108 and (ii) characteristics module 134 determines a respective thermal characteristic 140 for each electrochemical cell assembly 108 from the respective electrical time constant 138 for the electrochemical cell assembly 108. In another example of block 1604, characteristics module 1334 determines a respective thermal characteristic 1340 for each electrochemical cell assembly 108 of energy storage system 1302 based on the respective temperature response 1338 of the electrochemical cell assembly 108.

Method 1600 proceeds from block 1604 to a block 1606 where respective thermal characteristics of two or more electrochemical cell assemblies having a common location in their respective energy storage assemblies are compared. In one example of block 1606, comparison module 1044 compares respective thermal characteristics 140 of two or more electrochemical cell assemblies 108 in energy storage system 1002 having a common location in their respective energy storage assemblies 1008 and generates a comparison result 1048 representing a result of the comparison. In another example of block 1606, comparison module 1044 performs one or more of the following comparisons and generates associated comparison results 1048 for energy storage system 1200: (i) compare respective thermal characteristics 140 of two or more containers 1202, (ii) compare respective thermal characteristics 140 of two or more stacks 1204 having a common location in their respective containers 1202, (iii) compare respective thermal characteristics 140 of two or more racks 1206 having a common location in their respective stacks 1204, and (iv) compare respective thermal characteristics 140 of two or more modules 1208 having a common location in their respective racks 1206. In an additional example of block 1606, comparison module 1044 compares respective thermal characteristics 1340 of two or more electrochemical cell assemblies 108 in energy storage system 1302 having a common location in their respective energy storage assemblies 1308 and generates a comparison result 1048 representing a result of the comparison.

Combinations of Features

Features described above may be combined in various ways without departing from the scope hereof. The following examples illustrate some possible combinations.

(A1) A method for determining respective thermal characteristics of a plurality of electrochemical cell assemblies in an energy storage system includes (1) sensing open circuit voltage of each electrochemical cell assembly of the plurality of electrochemical cell assemblies over a measurement time period, (2) during the measurement time period, controlling temperature control equipment of the energy storage system to change a temperature setpoint of a heat transfer fluid, the heat transfer fluid being in thermal communication with the plurality of electrochemical cell assemblies, (3) generating a respective voltage profile for each electrochemical cell assembly, each voltage profile representing open circuit voltage of its respective electrochemical cell assembly over the measurement time period, (4) determining a respective electrical time constant for each electrochemical cell assembly from the respective voltage profile for the electrochemical cell assembly, each electrical time constant representing time for open circuit voltage of its respective electrochemical cell assembly to change in response to the change of the temperature setpoint of the heat transfer fluid, and (5) determining a respective thermal characteristic for each electrochemical cell assembly at least partially based on the respective electrical time constant for the electrochemical cell assembly.

(A2) In the method denoted as (A1), (1) the respective thermal characteristic for each electrochemical cell assembly may include a respective thermal time constant for the electrochemical cell assembly, and (2) determining the respective thermal characteristic for each electrochemical cell assembly based at least partially based on the respective electrical time constant for the electrochemical cell assembly may include setting the respective thermal time constant for the electrochemical cell assembly equal to the respective electrical time constant for the electrochemical cell assembly.

(A3) In the method denoted as (A1), (1) the respective thermal characteristic for each electrochemical cell assembly may include a respective thermal resistance value for the electrochemical cell assembly, and (2) determining the respective thermal characteristic for each electrochemical cell assembly based at least partially based on the respective electrical time constant for the electrochemical cell assembly may include setting the respective thermal resistance value for the electrochemical cell assembly equal to a scaled value of the respective electrical time constant for the electrochemical cell assembly.

(A4) In any one of the methods denoted as (A1) through (A3), the heat transfer fluid may be either a liquid or a gas.

(A5) Any one of the methods denoted as (A1) through (A4) may further include, before sensing open circuit voltage of each electrochemical cell assembly, operating each electrochemical cell assembly in a predetermined state for a predetermined amount of time.

(A6) Any one of the methods denoted as (A1) through (A5) may further include, before sensing open circuit voltage of each electrochemical cell assembly, adjusting a respective state of charge (SOC) of one or more electrochemical cell assemblies of the plurality of electrochemical cell assemblies so that each electrochemical cell assembly has a respective SOC that is within a predetermined range of SOC.

(A7) Any one of the methods denoted as (A1) through (A6) may further include, before sensing open circuit voltage of each electrochemical cell assembly, maintaining the temperature setpoint of the heat transfer fluid at a constant value for at least a predetermined amount of time.

(A8) Any one of the methods denoted as (A1) through (A7) may further include, before determining the respective electrical time constant for each electrochemical cell assembly from the respective voltage profile for the electrochemical cell assembly, determining that each electrochemical cell assembly has reached one of (i) a respective steady-state open circuit voltage and (ii) a respective stable open circuit voltage pattern.

(A9) Any one of the methods denoted as (A1) through (A8) may further include, after determining the respective thermal characteristic for each electrochemical cell assembly, controlling the temperature control equipment of the energy storage system at least partially based on the respective thermal characteristic of one or more of the plurality of electrochemical cell assemblies.

(A10) Any one of the methods denoted as (A1) through (A9) may further include controlling charging or discharging of a first electrochemical cell assembly of the plurality of electrochemical cell assemblies at least partially based on the respective thermal characteristic for the first electrochemical cell assembly.

(A11) In any one of the methods denoted as (A1) through (A10), (1) the plurality of electrochemical cell assemblies may be distributed among a plurality of energy storage assemblies in the energy storage system such that each energy storage assembly includes a respective two or more electrochemical cell assemblies of the plurality of electrochemical cell assemblies, and (2) the method may further include, for each energy storage assembly, controlling one or more of (i) rate of charging or discharging of the electrochemical cell assemblies included in the energy storage assembly, (ii) a minimum state of charge value of the electrochemical cell assemblies included in the energy storage assembly, (iii) a maximum state of charge value of the electrochemical cell assemblies included in the energy storage assembly, at least partially based on a respective representative thermal characteristic of the energy storage assembly, the respective representative thermal characteristic of the energy storage assembly being one of (i) an average thermal characteristic, (ii) a mean thermal characteristic, (iii) a maximum thermal characteristic, and (iv) a minimum thermal characteristic, of the electrochemical cell assemblies included in the energy storage assembly.

(A12) In the method denoted as (A11), each energy storage assembly of the plurality of energy storage assemblies may be selected from the group consisting of (i) a respective module of the energy storage system, (ii) a respective rack of the energy storage system, (iii) a respective stack of the energy storage system, and (iv) a respective container of the energy storage system.

(A13) Any one of the methods denoted as (A1) through (A12) may further include generating a resistive-capacitive thermal model of the plurality of electrochemical cell assemblies at least partially using the respective thermal characteristic for each electrochemical cell assembly.

(A14) In any one of the methods denoted as (A1) through (A10), the plurality of electrochemical cell assemblies may be distributed among a plurality of energy storage assemblies in the energy storage system such that each energy storage assembly includes a respective two or more electrochemical cell assemblies of the plurality of electrochemical cell assemblies.

(A15) The method denoted as (A14) may further include determining a respective representative thermal characteristic for each energy storage assembly at least partially based on the respective thermal characteristics of the electrochemical cell assemblies included in the energy storage assembly.

(A16) In the method denoted as (A15), the respective representative thermal characteristic for each energy storage assembly may be one of an average thermal characteristic of the electrochemical cell assemblies included in the energy storage assembly, a mean thermal characteristic of the electrochemical cell assemblies included in the energy storage assembly, a minimum thermal characteristic of the electrochemical cell assemblies included in the energy storage assembly, and a maximum thermal characteristic of the electrochemical cell assemblies included in the energy storage assembly.

(A17) The method denoted as (A14) may further include comparing respective thermal characteristics of two or more electrochemical cell assemblies having a common location in their respective energy storage assemblies.

(A18) In the method denoted as (A17), the common location in their respective energy storage assemblies may include a common row and a common column in their respective energy storage assemblies.

(A19) In any one of the methods denoted as (A14) through (A18), each energy storage assembly of the plurality of energy storage assemblies may be selected from the group consisting of (i) a respective module of the energy storage system, (ii) a respective rack of the energy storage system, (iii) a respective stack of the energy storage system, and (iv) a respective container of the energy storage system.

(A20) In any one of the methods denoted as (A1) through (A19), each electrochemical cell assembly of the plurality of electrochemical cell assemblies may consist of a single respective electrochemical cell.

(A21) In any one of the methods denoted as (A1) through (A19), each electrochemical cell assembly of the plurality of electrochemical cell assemblies may include a plurality of respective electrochemical cells electrically coupled in parallel.

(B1) A method for determining respective thermal characteristics of a plurality of electrochemical cell assemblies in an energy storage system includes (1) at a first time, beginning recording of respective open circuit voltages of the plurality of electrochemical cell assemblies, (2) after the first time but before a second time, controlling temperature control equipment of the energy storage system to change a temperature setpoint of a heat transfer fluid, the heat transfer fluid being in thermal communication with the plurality of electrochemical cell assemblies, (3) at the second time, ending recording of the respective open circuit voltages of the plurality of electrochemical cell assemblies, (4) generating a respective voltage profile for each electrochemical cell assembly from the respective open circuit voltages of the electrochemical cell assembly recorded from the first time to the second time, (5) determining a respective electrical time constant for each electrochemical cell assembly from the respective voltage profile for the electrochemical cell assembly, each electrical time constant representing time for open circuit voltage of its respective electrochemical cell assembly to change in response to the change of the temperature setpoint of the heat transfer fluid, and (6) determining a respective thermal characteristic for each electrochemical cell assembly at least partially based on the respective electrical time constant for the electrochemical cell assembly.

(B2) The method denoted as (B1) may further include ending recording of the respective open circuit voltages of the plurality of electrochemical cell assemblies at the second time in response to the respective open circuit voltage each electrochemical cell assembly having reached one of (i) a respective steady-state value and (ii) a respective stable open circuit voltage pattern.

(B3) In any one of the methods denoted as (B1) and (B2), (1) the respective thermal characteristic for each electrochemical cell assembly may include a respective thermal time constant for the electrochemical cell assembly, and (2) determining the respective thermal characteristic for each electrochemical cell assembly based at least partially based on the respective electrical time constant for the electrochemical cell assembly may include setting the respective thermal time constant for the electrochemical cell assembly equal to the respective electrical time constant for the electrochemical cell assembly.

(B4) In any one of the methods denoted as (B1) and (B2), (1) the respective thermal characteristic for each electrochemical cell assembly may include a respective thermal resistance value for the electrochemical cell assembly, and (2) determining the respective thermal characteristic for each electrochemical cell assembly based at least partially based on the respective electrical time constant for the electrochemical cell assembly may include setting the respective thermal resistance value for the electrochemical cell assembly equal to a scaled value of the respective electrical time constant for the electrochemical cell assembly.

(B5) In any one of the methods denoted as (B1) through (B4), the heat transfer fluid may be either a liquid or a gas.

(B6) Any one of the methods denoted as (B1) through (B5) may further include, before the first time, operating each electrochemical cell assembly in a predetermined state for a predetermined amount of time.

(B7) Any one of the methods denoted as (B1) through (B6) may further include, before the first time, adjusting a respective state of charge (SOC) of one or more electrochemical cell assemblies of the plurality of electrochemical cell assemblies so that each electrochemical cell has a respective SOC that is within a predetermined range of SOC.

(B8) Any one of the methods denoted as (B1) through (B7) may further include, before the first time, maintaining the temperature setpoint of the heat transfer fluid at a constant value for at least a predetermined amount of time.

(B9) Any one of the methods denoted as (B1) through (B8) may further include, after determining the respective thermal characteristic for each electrochemical cell assembly, controlling the temperature control equipment of the energy storage system at least partially based on the respective thermal characteristics of one or more of the plurality of electrochemical cell assemblies.

(B10) Any one of the methods denoted as (B1) through (B9) may further include controlling charging or discharging of a first electrochemical cell assembly of the plurality of electrochemical cell assemblies at least partially based on the respective thermal characteristic for the first electrochemical cell assembly.

(B11) In any one of the methods denoted as (B1) through (B10), (1) the plurality of electrochemical cell assemblies may be distributed among a plurality of energy storage assemblies in the energy storage system such that each energy storage assembly includes a respective two or more electrochemical cell assemblies of the plurality of electrochemical cell assemblies, and (2) the method may further include controlling charging or discharging of the electrochemical cell assemblies included in each energy storage assembly at least partially based on a respective representative thermal characteristic of the energy storage assembly, the respective representative thermal characteristic of each energy storage assembly being one of (i) an average thermal characteristic, (ii) a mean thermal characteristic, (iii) a maximum thermal characteristic, and (iv) a minimum thermal characteristic, of the electrochemical cell assemblies included in the energy storage assembly.

(B12) In the method denoted as (B11), each energy storage assembly of the plurality of energy storage assemblies may be selected from the group consisting of (i) a respective module of the energy storage system, (ii) a respective rack of the energy storage system, (iii) a respective stack of the energy storage system, and (iv) a respective container of the energy storage system.

(B13) Any one of the methods denoted as (B1) through (B12) may further include generating a resistive-capacitive thermal model of the plurality of electrochemical cell assemblies at least partially using the respective thermal characteristic for each electrochemical cell assembly.

(B14) In any one of the methods denoted as (B1) through (B10), the plurality of electrochemical cell assemblies may be distributed among a plurality of energy storage assemblies in the energy storage system such that each energy storage assembly includes a respective two or more electrochemical cell assemblies of the plurality of electrochemical cell assemblies (B15) The method denoted as (B14) may further include determining a respective representative thermal characteristic for each energy storage assembly at least partially based on the respective thermal characteristics of the electrochemical cell assemblies included in the energy storage assembly.

(B16) In the method denoted as (B15), the respective representative thermal characteristic for each energy storage assembly may be one of an average thermal characteristic of the electrochemical cell assemblies included in the energy storage assembly, a mean thermal characteristic of the electrochemical cell assemblies included in the energy storage assembly, a minimum thermal characteristic of the electrochemical cell assemblies included in the energy storage assembly, and a maximum thermal characteristic of the electrochemical cell assemblies included in the energy storage assembly.

(B17) Any one of the methods denoted as (B15) and (B16) may further include comparing respective thermal characteristics of two or more electrochemical cell assemblies having a common location in their respective energy storage assemblies.

(B18) In the method denoted as (B17), the common location in their respective energy storage assemblies may include a common row and a common column in their respective energy storage assemblies.

(B19) In any one of the methods denoted as (B14) through (B18), each energy storage assembly of the plurality of energy storage assemblies may be selected from the group consisting of (i) a respective module of the energy storage system, (ii) a respective rack of the energy storage system, (iii) a respective stack of the energy storage system, and (iv) a respective container of the energy storage system.

(B20) In any one of the methods denoted as (B1) through (B19), each electrochemical cell assembly of the plurality of electrochemical cell assemblies may consist of a single respective electrochemical cell.

(B21) In any one of the methods denoted as (B1) through (B19), each electrochemical cell assembly of the plurality of electrochemical cell assemblies may include a plurality of respective electrochemical cells electrically coupled in parallel.

(C1) A method for evaluating thermal performance of an energy storage system including a plurality of electrochemical cell assemblies, the plurality of electrochemical cell assemblies being distributed among a plurality of energy storage assemblies in the energy storage system such that each energy storage assembly includes a respective two or more electrochemical cell assemblies of the plurality of electrochemical cell assemblies, includes (1) sensing at least one of (i) a respective temperature response of each electrochemical cell assembly of the plurality of electrochemical cell assemblies to a known thermal load and (ii) a respective open circuit voltage of each electrochemical cell assembly of the plurality of electrochemical cell assemblies, (2) determining a respective thermal characteristic for each electrochemical cell assembly from one or more of (i) the respective temperature response of each electrochemical cell assembly of the plurality of electrochemical cell assemblies to the known thermal load and (ii) the respective open circuit voltage of each electrochemical cell assembly of the plurality of electrochemical cell assemblies, and (3) determining a respective representative thermal characteristic for each energy storage assembly based on the respective thermal characteristics of the electrochemical cell assemblies included in the energy storage assembly.

(C2) In the method denoted as (C1), the respective representative thermal characteristic for each energy storage assembly may be one of an average thermal characteristic for the energy storage assembly, a mean thermal characteristic for the energy storage assembly, a minimum thermal characteristic for the energy storage assembly, and a maximum thermal characteristic for the energy storage assembly.

(C3) In any one of the methods denoted as (C1) and (C2), determining the respective thermal characteristic for each electrochemical cell assembly from one or more of (i) the respective temperature response of each electrochemical cell assembly of the plurality of electrochemical cell assemblies to the known thermal load and (ii) the respective open circuit voltage of each electrochemical cell assembly of the plurality of electrochemical cell assemblies may include determining the respective thermal characteristic for each electrochemical cell assembly at least partially based on a respective time required for open circuit voltage of each electrochemical cell assembly to change in response to a change in a temperature of heat transfer fluid in thermal communication with the plurality of electrochemical cell assemblies.

(C4) In any one of the methods denoted as (C1) through (C3), each energy storage assembly of the plurality of energy storage assemblies may be selected from the group consisting of (i) a respective module of the energy storage system, (ii) a respective rack of the energy storage system, (iii) a respective stack of the energy storage system, and (iv) a respective container of the energy storage system.

(D1) A method for evaluating thermal performance of an energy storage system including a plurality of electrochemical cell assemblies, the plurality of electrochemical cell assemblies being distributed among a plurality of energy storage assemblies in the energy storage system such that each energy storage assembly includes a respective two or more electrochemical cell assemblies of the plurality of electrochemical cell assemblies includes (1) sensing at least one of (i) a respective temperature response of each electrochemical cell assembly of the plurality of electrochemical cell assemblies to a known thermal load and (ii) a respective open circuit voltage of each electrochemical cell assembly of the plurality of electrochemical cell assemblies, (2) determining a respective thermal characteristic for each electrochemical cell assembly from one or more of (i) the respective temperature response of each electrochemical cell assembly of the plurality of electrochemical cell assemblies to the known thermal load and (ii) the respective open circuit voltage of each electrochemical cell assembly of the plurality of electrochemical cell assemblies, and (3) comparing respective thermal characteristics of two or more electrochemical cell assemblies having a common location in their respective energy storage assemblies.

(D2) In the method denoted as (D1), the common location in their respective energy storage assemblies may include a common row and a common column in their respective energy storage assemblies.

(D3) In either one of the methods denoted as (D1) and (D2), each energy storage assembly of the plurality of energy storage assemblies may be selected from the group consisting of (i) a respective module of the energy storage system, (ii) a respective rack of the energy storage system, (iii) a respective stack of the energy storage system, and (iv) a respective container of the energy storage system.

(D4) In any one of the methods denoted as (D1) through (D3), determining the respective thermal characteristic for each electrochemical cell assembly from one or more of (i) the respective temperature response of each electrochemical cell assembly of the plurality of electrochemical cell assemblies to the known thermal load and (ii) the open circuit voltage of each electrochemical cell assembly of the plurality of electrochemical cell assemblies may include determining the respective thermal characteristic for each electrochemical cell assembly at least partially based on a respective time required for open circuit voltage of each electrochemical cell assembly to change in response to a change in a temperature of heat transfer fluid in thermal communication with the plurality of electrochemical cell assemblies.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A method for determining respective thermal characteristics of a plurality of electrochemical cell assemblies in an energy storage system, the method comprising:

sensing open circuit voltage of each electrochemical cell assembly of the plurality of electrochemical cell assemblies over a measurement time period;

during the measurement time period, controlling temperature control equipment of the energy storage system to change a temperature setpoint of a heat transfer fluid, the heat transfer fluid being in thermal communication with the plurality of electrochemical cell assemblies;

generating a respective voltage profile for each electrochemical cell assembly, the respective voltage profile for each electrochemical cell assembly representing open circuit voltage of the electrochemical cell assembly over the measurement time period;

determining a respective electrical time constant for each electrochemical cell assembly from the respective voltage profile for the electrochemical cell assembly, the respective electrical time constant for each electrochemical cell assembly representing time for open circuit voltage of the electrochemical cell assembly to change in response to the change of the temperature setpoint of the heat transfer fluid;

determining a respective thermal characteristic for each electrochemical cell assembly at least partially based on the respective electrical time constant for the electrochemical cell assembly; and after determining the respective thermal characteristic for each electrochemical cell assembly, controlling at least partially based on the respective thermal characteristic of one or more of the plurality of electrochemical cell assemblies one or more of (i) the temperature control equipment of the energy storage system and (ii) a battery management system (BMS) node control of the energy storage system.

2. The method of claim 1, wherein:

the respective thermal characteristic for each electrochemical cell assembly comprises one of a respective thermal time constant for the electrochemical cell assembly and a respective thermal resistance value for the electrochemical cell assembly; and determining the respective thermal characteristic for each electrochemical cell assembly at least partially based on the respective electrical time constant for the electrochemical cell assembly comprises setting the respective thermal characteristic for the electrochemical cell assembly equal to one of (i) the respective electrical time constant for the electrochemical cell assembly and (ii) a scaled value of the respective electrical time constant for the electrochemical cell assembly.

3. The method of claim 1, further comprising, before sensing open circuit voltage of each electrochemical cell assembly, adjusting a respective state of charge (SOC) of one or more electrochemical cell assemblies of the plurality of electrochemical cell assemblies so that each electrochemical cell assembly has a respective SOC that is within a predetermined range of SOC.

4. The method of claim 1, further comprising, before determining the respective electrical time constant for each electrochemical cell assembly from the respective voltage profile for the electrochemical cell assembly, determining that each electrochemical cell assembly has reached one of (i) a respective steady-state open circuit voltage and (ii) a respective stable open circuit voltage pattern.

5. The method of claim 1, wherein:

the plurality of electrochemical cell assemblies is distributed among a plurality of energy storage assemblies in the energy storage system such that each energy storage assembly includes a respective two or more electrochemical cell assemblies of the plurality of electrochemical cell assemblies; and the method further comprises controlling, for each energy storage assembly, one of more of (i) rate of charging or discharging of the electrochemical cell assemblies included in the energy storage assembly, (ii) a minimum state of charge value of the electrochemical cell assemblies included in the energy storage assembly, (iii) a maximum state of charge value of the electrochemical cell assemblies included in the energy storage assembly, at least partially based on a respective representative thermal characteristic of the energy storage assembly, the respective representative thermal characteristic of the energy storage assembly being one of (i) an average thermal characteristic, (ii) a mean thermal characteristic, (iii) a maximum thermal characteristic, and (iv) a minimum thermal characteristic, of the electrochemical cell assemblies included in the energy storage assembly.

6. The method of claim 5, wherein each energy storage assembly of the plurality of energy storage assemblies is selected from the group consisting of (i) a respective module of the energy storage system, (ii) a respective rack of the energy storage system, (iii) a respective stack of the energy storage system, and (iv) a respective container of the energy storage system.

7. The method of claim 1, further comprising generating a resistive-capacitive thermal model of the plurality of electrochemical cell assemblies at least partially using the respective thermal characteristic for each electrochemical cell assembly.

8. The method of claim 1, wherein the plurality of electrochemical cell assemblies is distributed among a plurality of energy storage assemblies in the energy storage system such that each energy storage assembly includes a respective two or more electrochemical cell assemblies of the plurality of electrochemical cell assemblies.

9. The method of claim 8, further comprising determining a respective representative thermal characteristic for each energy storage assembly at least partially based on the respective thermal characteristics of the electrochemical cell assemblies included in the energy storage assembly.

10. The method of claim 9, wherein the respective representative thermal characteristic for each energy storage assembly is one of an average thermal characteristic of the electrochemical cell assemblies included in the energy storage assembly, a mean thermal characteristic of the electrochemical cell assemblies included in the energy storage assembly, a minimum thermal characteristic of the electrochemical cell assemblies included in the energy storage assembly, and a maximum thermal characteristic of the electrochemical cell assemblies included in the energy storage assembly.

11. The method of claim 8, further comprising comparing respective thermal characteristics of two or more electrochemical cell assemblies having a common location in their respective energy storage assemblies, the common location in their respective energy storage assemblies including a common row and a common column in their respective energy storage assemblies.

12. The method of claim 8, wherein each energy storage assembly of the plurality of energy storage assemblies is selected from the group consisting of (i) a respective module of the energy storage system, (ii) a respective rack of the energy storage system, (iii) a respective stack of the energy storage system, and (iv) a respective container of the energy storage system.

13. A method for determining respective thermal characteristics of a plurality of electrochemical cell assemblies in an energy storage system, the method comprising:

at a first time, beginning recording of respective open circuit voltages of the plurality of electrochemical cell assemblies;

after the first time but before a second time, controlling temperature control equipment of the energy storage system to change a temperature setpoint of a heat transfer fluid, the heat transfer fluid being in thermal communication with the plurality of electrochemical cell assemblies;

at the second time, ending recording of the respective open circuit voltages of the plurality of electrochemical cell assemblies;

generating a respective voltage profile for each electrochemical cell assembly from the respective open circuit voltages of the electrochemical cell assembly recorded from the first time to the second time;

determining a respective electrical time constant for each electrochemical cell assembly from the respective voltage profile for the electrochemical cell assembly, the respective electrical time constant for each electrochemical cell assembly representing time for open circuit voltage of the electrochemical cell assembly to change in response to the change of the temperature setpoint of the heat transfer fluid;

determining a respective thermal characteristic for each electrochemical cell assembly at least partially based on the respective electrical time constant for the electrochemical cell assembly; and after determining the respective thermal characteristic for each electrochemical cell assembly, controlling at least partially based on the respective thermal characteristic of one or more of the plurality of electrochemical cell assemblies one or more of (i) the temperature control equipment of the energy storage system and (ii) a battery management system (BMS) node control of the energy storage system.

14. The method of claim 13, further comprising ending recording of the respective open circuit voltages of the plurality of electrochemical cell assemblies at the second time in response to the respective open circuit voltage each electrochemical cell assembly having reached one of (i) a respective steady-state value and (ii) a respective stable open circuit voltage pattern.

15. The method of claim 13, wherein:

the respective thermal characteristic for each electrochemical cell assembly comprises a respective thermal time constant for the electrochemical cell assembly; and determining the respective thermal characteristic for each electrochemical cell assembly at least partially based on the respective electrical time constant for the electrochemical cell assembly comprises setting the respective thermal time constant for the electrochemical cell assembly equal to the respective electrical time constant for the electrochemical cell assembly.

16. The method of claim 13, wherein:

the respective thermal characteristic for each electrochemical cell assembly comprises a respective thermal resistance value for the electrochemical cell assembly; and determining the respective thermal characteristic for each electrochemical cell assembly at least partially based on the respective electrical time constant for the electrochemical cell assembly comprises setting the respective thermal resistance value for the electrochemical cell assembly equal to a scaled value of the respective electrical time constant for the electrochemical cell assembly.

17. The method of claim 13, further comprising, before the first time, operating each electrochemical cell assembly in a predetermined state for a predetermined amount of time.

18. The method of claim 13, further comprising, before the first time, maintaining the temperature setpoint of the heat transfer fluid at a constant value for at least a predetermined amount of time.

* * * * *